United States Patent [19]
Kubo et al.

[11] Patent Number: 5,602,415
[45] Date of Patent: Feb. 11, 1997

[54] LIGHT RECEIVING DEVICE WITH ISOLATION REGIONS

[75] Inventors: Masaru Kubo, Kitakatsuragi-gun; Naoki Fukunaga, Tenri; Motohiko Yamamoto, Ikoma-gun, all of Japan

[73] Assignee: Sharp Kabushiki Kaisha, Osaka, Japan

[21] Appl. No.: 458,772

[22] Filed: Jun. 2, 1995

[30] Foreign Application Priority Data

Jul. 14, 1994 [JP] Japan ................... 6-162412

[51] Int. Cl.$^6$ ................................. H01L 31/00
[52] U.S. Cl. .................. 257/443; 257/446; 257/448; 257/465
[58] Field of Search ................... 257/443, 446, 257/465, 448

[56] References Cited

U.S. PATENT DOCUMENTS

| | | | |
|---|---|---|---|
| 3,858,233 | 12/1974 | Miyata et al. | 357/30 |
| 4,837,429 | 6/1989 | Umezawa et al. | 257/443 X |
| 4,996,578 | 2/1991 | Motojima et al. | 357/30 |
| 5,177,581 | 1/1993 | Kubo et al. | 257/437 |
| 5,283,460 | 2/1994 | Mita | 257/446 X |
| 5,466,962 | 11/1995 | Yamamoto et al. | 257/443 X |

FOREIGN PATENT DOCUMENTS

| | | |
|---|---|---|
| 0405670A1 | 9/1991 | European Pat. Off. . |
| 0576009A1 | 12/1993 | European Pat. Off. . |
| 5632777 | 4/1981 | Japan ................... 257/443 |
| 1214174 | 8/1989 | Japan ................... 257/446 |
| 4-82268 | 3/1992 | Japan . |

*Primary Examiner*—William Mintel
*Attorney, Agent, or Firm*—Nixon & Vanderhye P.C.

[57] ABSTRACT

A light receiving device including a semiconductor substrate of a first conductivity type; a first semiconductor layer of a second conductivity type which is formed on the semiconductor substrate of the first conductivity type; and a semiconductor layer of the first conductivity type which elongates from a surface of the first semiconductor substrate of the second conductivity type to reach a surface of the semiconductor substrate of the first conductivity type, the semiconductor layer splitting the first semiconductor layer of the second conductivity type into a plurality of semiconductor regions of the second conductivity type. The portion of the semiconductor layer of the first conductivity type which overlaps with the semiconductor substrate of the first conductivity type is formed as a semiconductor region of the first conductivity type and has a high-impurity density. The semiconductor regions of the second conductivity type, and semiconductor substrate of the first conductivity type below such regions form a plurality of light detecting photodiode portions for detecting signal light. The device further includes a second semiconductor layer of the second conductivity type being buried in a part of the semiconductor substrate of the first conductivity type which constitutes each of the light detecting photodiode portions.

13 Claims, 20 Drawing Sheets

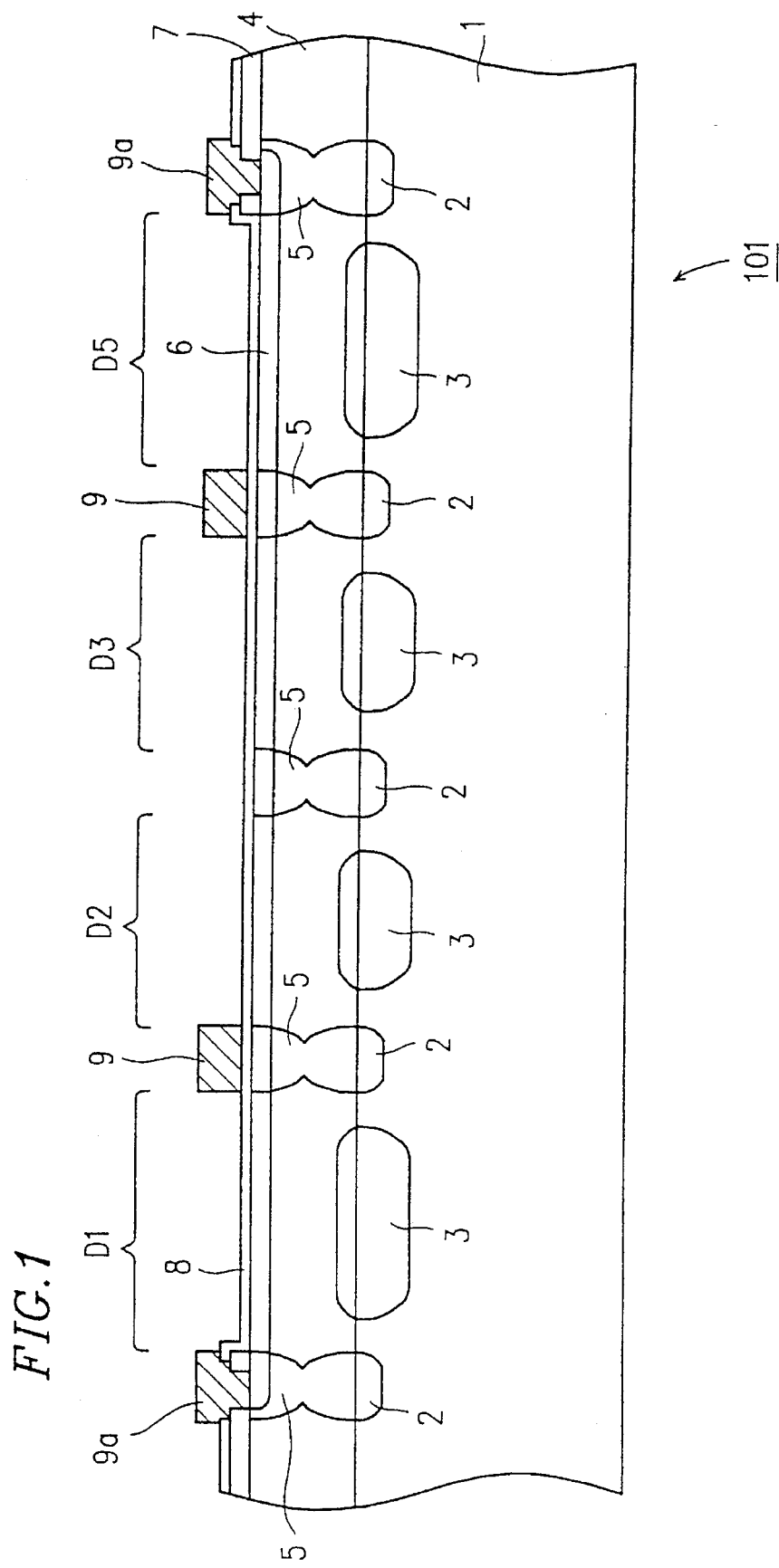

FIG. 7
(PRIOR ART)
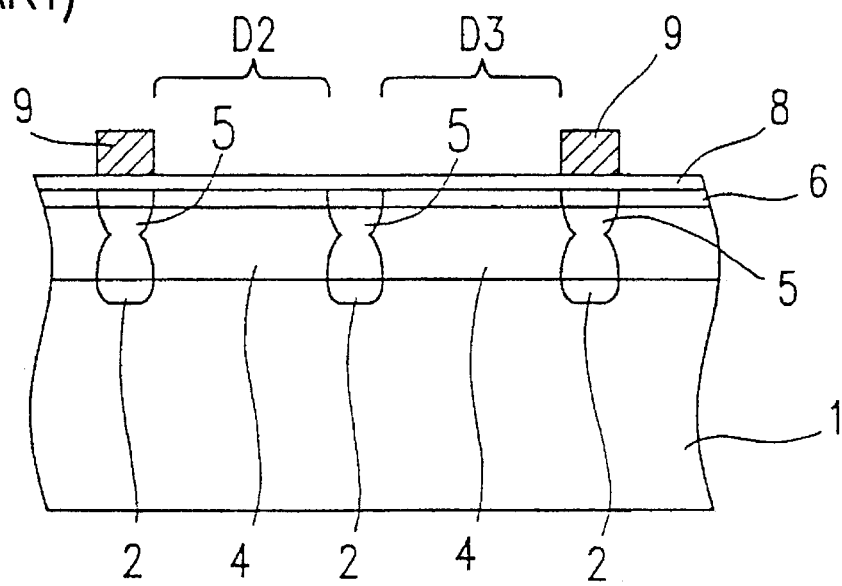
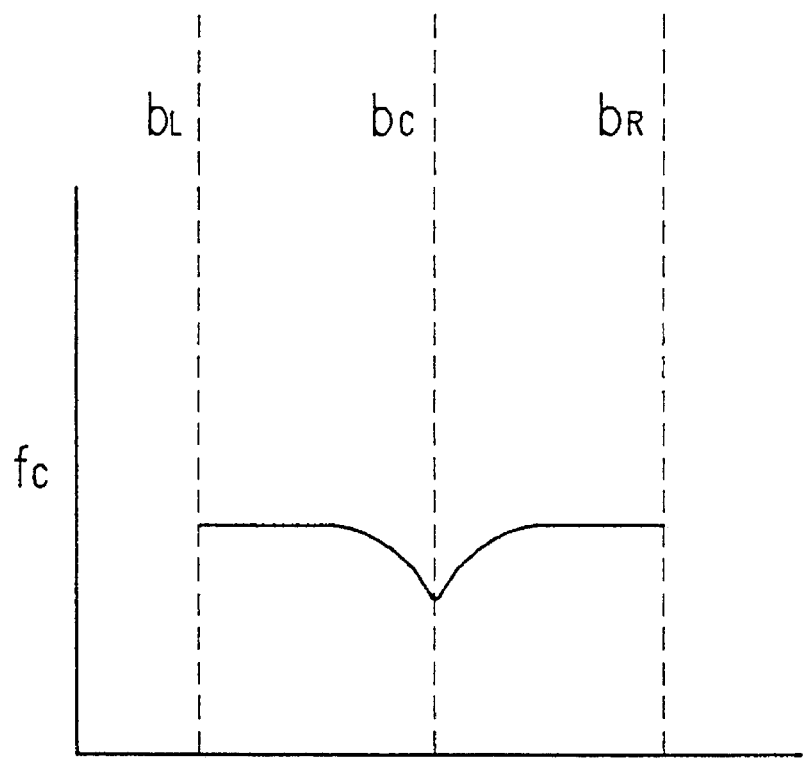
Light beam position

FIG.10
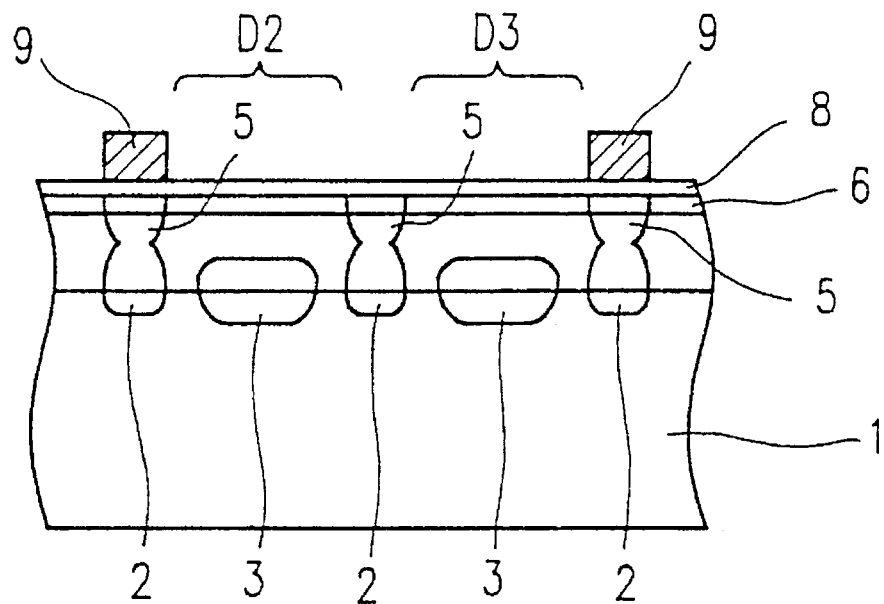
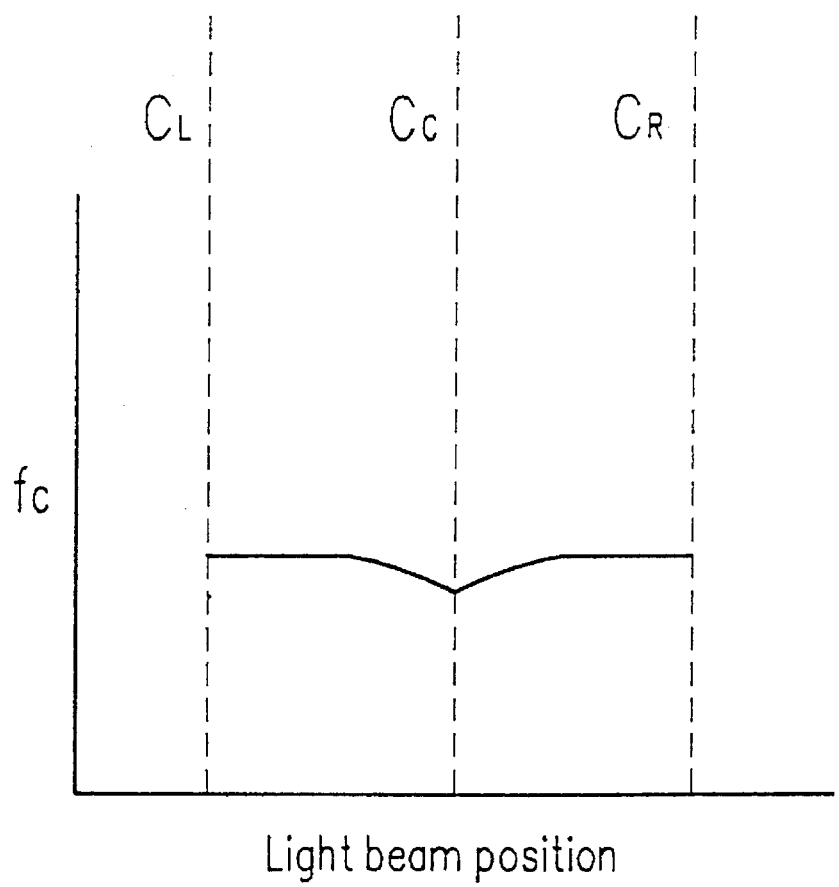

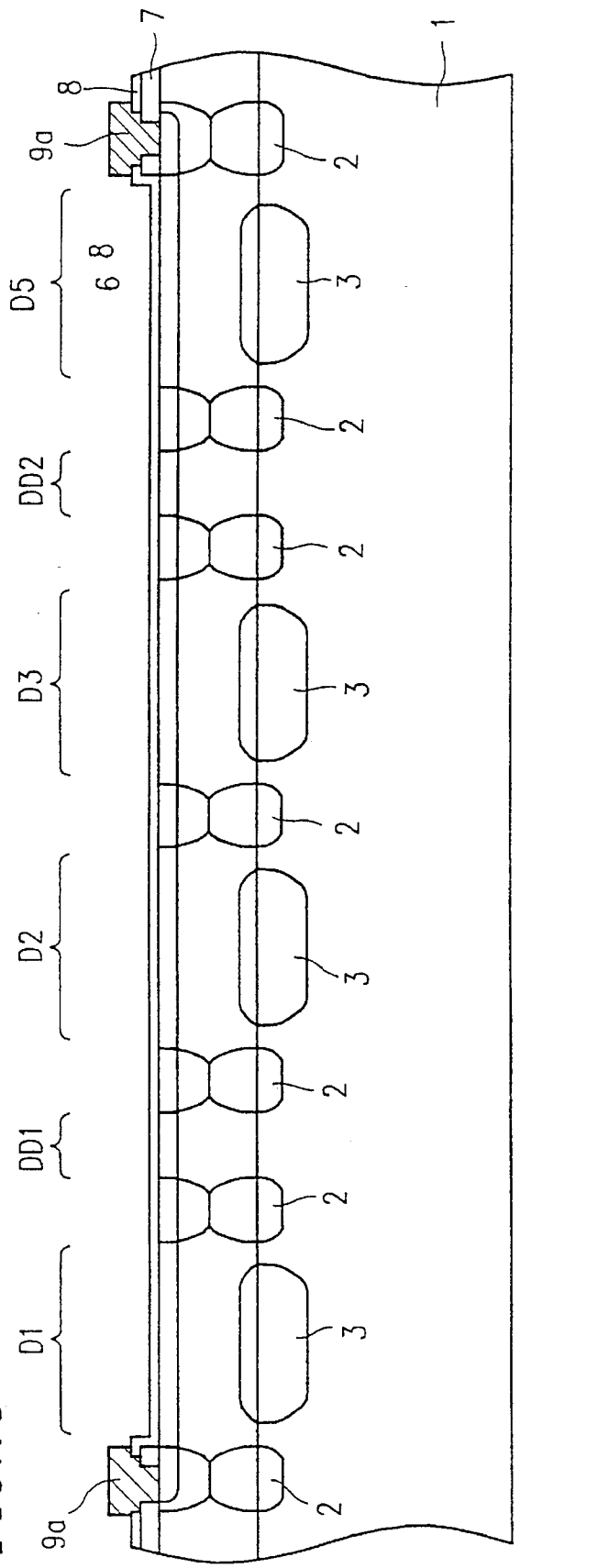

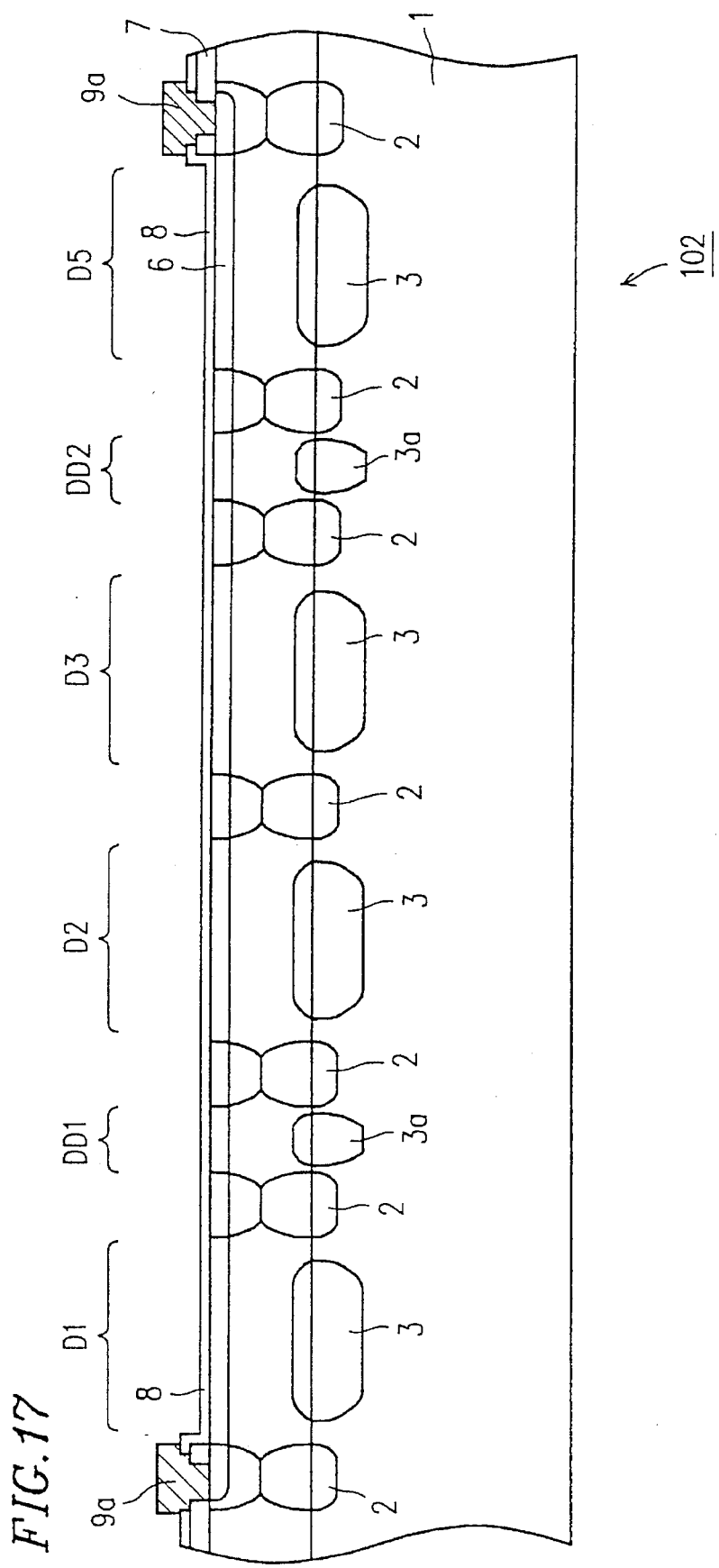

LIGHT RECEIVING DEVICE WITH ISOLATION REGIONS

BACKGROUND OF THE INVENTION

1. Field of the Invention

The invention relates to a circuit-incorporating light receiving device which incorporates a circuit for processing a photoelectric conversion signal, and particularly to a structure of a split photodiode, in which a light receiving region is split into a plurality of light detecting portions, which can improve the response speed, and which can reduce the deterioration of properties due to misalignment of optical split positions of the light detecting portions and structural split positions.

2. Description of the Related Art

Conventionally, for example, such a split photodiode is used as a signal detecting device for an optical pickup.

Recently, with the achievement of miniaturization and high performance of an optical disk apparatus, the reduction in size and weight of an optical pickup has become an important issue to be realized. In order to realize this, an optical module has been proposed which performs the functions of generating a tracking beam, conducting optical branching, and generating an error signal all in one hologram device; a laser diode, a photodiode, etc. are housed in one package (not shown); and the hologram device is disposed on the upper face of the package.

FIG. 3 diagrammatically shows the configuration of the optical system of the optical pickup. The principle of the signal detection in the optical system will be described briefly. Light emitted from a laser diode LD is split into three light beams, i.e., two subbeams for tracking and one main beam for reading a data signal. The light from the laser diode is split by a diffraction grating 30 which is disposed on the back face of the hologram device 31. The diffraction grating 30 is for generating a tracking beam.

The light beams which have passed as zero-order light through the hologram device 31 on the upper face of the package are converted into parallel light beams by a collimator lens 32, and then focused on a disk 34 by an objective lens 33. Reflected light beams which have undergone modulation by pits on the disk 34 pass through the objective lens 33 and the collimator lens 32, and are then diffracted by the hologram device 31. The diffracted beams are guided as first-order light onto a five-split photodiode PD having five split light detecting portions (hereinafter, often referred to as "light detecting photodiode portions") D1 to D5.

The hologram device 31 has two regions having different diffraction periods. Among reflected light of the main beam, a portion entering one of the regions is focused on an isolation line by which the light detecting portions D2 and D3 are split from each other, and a portion entering the other region is focused on the light detecting portion D4. The reflected light of each subbeam is focused on respective ones of the light detecting portions D1 and D5 by hologram device 31. Depending on the change of the distance between the hologram device 31 and the disk 34, the position of the reflected light of the main beam on the photodiode PD is moved in the direction along which the light detecting photodiode portions D2 and D3 are aligned, so that, when the main beam is focused on the disk, the reflected light of the main beam enters the isolation region between the light detecting photodiode portions D2 and D3.

When the outputs of the five-split photodiode PD respectively corresponding to the light detecting portions D1 to D5 are indicated by S1 to S5, the focus error signal FES is given by the following equation:

$$FES = S2 - S3$$

On the other hand, the tracking error is detected by the so-called three-beam method. Since the two tracking subbeams are focused on the light detecting portions D1 and D5, respectively, the tracking error signal TES is given by the following equation:

$$TES = S1 - S5$$

When the error signal TES is 0, it means that the main beam is correctly positioned on a track to be irradiated. The reproduction signal RF is given as the total sum of the outputs of the light detecting portions D2 to D4 receiving the reflected light of the main beam, or as follows:

$$RF = S2 + S3 + S4$$

FIG. 4 is a plan view showing the structure of the five-split photodiode PD which is incorporated in the configuration of the above-mentioned optical system. The shape of the five-split photodiode depends on the optical system. In this example, the light detecting portions of the photodiode have a lengthways elongated shape. This shape is determined by the reason described below.

The laser diode LD and the photodiode PD constituting the optical system are incorporated in one package, and the hologram device 31 is adhered to the upper face of the package. The positions of the laser diode and the photodiode are caused to be varied in the processes of positioning them. Moreover, the oscillation wavelength of the laser diode LD is different between devices, and changes due to temperature variations. Variations produced in the processes of positioning the laser diode and the photodiode, and variations of the oscillation wavelength cause the angle of diffraction of diffracted light to be changed. Accordingly, the light receiving face of the photodiode PD is required to have a larger dimension in the Y-direction as shown in FIG. 4, or the direction along which the incidence position of reflected light on the photodiode is changed when the angle of diffraction is changed.

The dimension in the X-direction of the light receiving face which is perpendicular to Y-direction is not affected by the change of the angle of diffraction which is caused by variations of the oscillation wavelength of the laser diode between devices and changes in oscillation wavelength owing to the temperature variation. Since variations produced in the processes of positioning the laser diode and the photodiode can be adjusted by rotating the hologram device 31 when the device is adhered to the upper face of the package, the dimension of the light receiving face in the X-direction is not required to have a large value. Conversely, in the X-direction of the light receiving face, the adjustment in the process of incorporating the optical pickup in an optical disk apparatus is difficult when the three beams arranged in the X-direction are separated from each other. In the photodiode, therefore, the widths of the light detecting portions D1 to D5, and those of the isolation regions between the light detecting portions must be narrowed.

For the above-mentioned reason, the light detecting portions of the photodiode PD naturally have a lengthways elongated shape as shown in FIG. 4.

FIG. 5 shows the cross-sectional structure of the portion of the photodiode along line a–a' shown in FIG. 4. In FIG.

4, 201 designates a five-split photodiode for detecting light which has conventionally been used, 202 designates an anode electrode which is common to light detecting photodiode portions D1 to D5, and 203a to 203e designate cathode electrodes respectively corresponding to the light detecting photodiode portions D1 to D5. In the figure, components formed in steps conducted after the metallization step, such as multi-layer conductors, a passivation film, and the like are not shown.

The photodiode is produced in the following manner. First, P-type buried diffusion layers 2 are formed in regions on a P-type semiconductor substrate 1 which will be formed as the isolation regions used for splitting the light detecting portion (FIG. 6A).

Next, as shown in FIG. 6B, an N-type epitaxial layer 4 is formed on the entire surface of the P-type semiconductor substrate 1. P-type isolation diffusion layers 5 elongating from the surface of the N-type epitaxial layer 4 to the portions corresponding to the P-type buried diffusion layers 2 are then formed so that the light detecting portions D1 to D5 which are electrically isolated from each other are formed.

A P-type diffusion layer 6 is then formed on the surface of the N-type epitaxial layer 4, and also on the surfaces of the P-type isolation diffusion layers 5 which will be formed as the isolation regions for the light detecting portions D1 to D5 (FIG. 6C).

As shown in FIG. 6D, in an oxide film 7 which is formed on the surface in the step of forming the P-type diffusion layer 6, the portion corresponding to the light receiving region of the surface of the P-type diffusion layer 6 is removed. Then, a nitride film 8 is formed on the entire surface. In order that the nitride film 8 will function as an anti-reflection film, the thickness of the nitride film 8 is selected so as to conform to the wavelength of the laser diode.

Next, openings are formed in the nitride film 8 and the oxide film 7 to form electrode windows. Electrode conductors 9a are formed, and at the same time metal films 9 are formed on portions of the surface of the nitride film 8 which are not irradiated with signal light, thereby obtaining the five-split photodiode having the structure shown in FIG. 5. A signal processing circuit (not shown) is formed on the semiconductor substrate 1 by a usual bipolar IC process.

In the thus configured five-split photodiode PD, the PN junctions of the isolation regions for the light detecting portions D1 to D5 are covered by the P-type diffusion layer 6. Even when the nitride film 8 is formed directly on the surface of the photodiode, problems such as increased junction leakage do not arise. In the isolation region between the light detecting portions D2 and D3 of the photodiode on which a focused beam actually impinges, therefore, the reflection of the focused beam at the light receiving face is suppressed to a low level by the nitride film 8. Consequently, the high sensitivity of the photodiode can be realized.

Since the metal film 9 is formed in the portions which are not irradiated with signal light, in the example, the portions between the light detecting portions D1 and D2, and D3 and D5, the photodiode is hardly affected by stray light or the like so that the S/N ratio of the photodiode is improved.

However, particularly, the light detecting portions D2, D3, and D4 which process the reproduction signal RF are required to operate at a high speed. It was found that, in the light detecting portions D2 and D3, the cutoff frequency obtained when the isolation regions of these portions are irradiated with a light beam is lower than that obtained when the center region of the respective light detecting portions is irradiated with a light beam. FIG. 7 shows the experimental results.

The state where the isolation region of the adjacent light detecting portions was irradiated with a light beam was analyzed by using a device simulation system. As a result, it was found that, under this state, optical carriers detour around the P-type buried diffusion layer 2 of the isolation region and reach the junction of the N-type epitaxial layer 4 and the P-type semiconductor substrate 1 so that optical carriers are caused to move a longer distance by diffusion, thereby causing the cutoff frequency to be lowered.

In FIG. 8, directions of currents in the P-type buried diffusion layer 2 of the isolation region and in the vicinity thereof are indicated by arrows. Electrons which function as optical carriers move in directions opposite to those of the arrows.

FIG. 9 shows the potential distribution in the depth direction of the isolation diffusion layer 5 of the isolation region. As seen from the figure, the potential distribution operates as a potential barrier against electrons which function as optical carriers in the substrate and directed toward the surface of the substrate. Therefore, it was found that optical carriers detour around the P-type buried diffusion layer 2. The detour causes the moving distance of electrons to be the order of 10 micrometers.

SUMMARY OF THE INVENTION

The light receiving device according to the present invention comprises: a semiconductor substrate of a first conductivity type; a first semiconductor layer of a second conductivity type which is formed on said semiconductor substrate of the first conductivity type; a semiconductor layer of the first conductivity type which elongates from a surface of said first semiconductor layer of the second conductivity type to reach a surface of said semiconductor substrate of the first conductivity type, said semiconductor layer splitting said first semiconductor layer of the second conductivity type into a plurality of semiconductor regions of the second conductivity type; a portion of said semiconductor layer of the first conductivity type extends into said semiconductor substrate of the first conductivity type being formed as a semiconductor region of the first conductivity type and having a higher impurity density than the substrate; said plurality of semiconductor regions of the second conductivity type, and portions of said semiconductor substrate of the first conductivity type below said regions forming a plurality of light detecting photodiode portions for detecting signal light, respectively; and a second semiconductor layer of the second conductivity type being buried in a part of said portions of said semiconductor substrate of the first conductivity type which constitute said light detecting photodiode portions.

In one embodiment of the invention, said semiconductor layer of the first conductivity type splitting said first semiconductor layer of the second conductivity type consists of a first diffusion layer which is buried in said first semiconductor substrate of the first conductivity type, and a second diffusion layer which is formed from a surface of said first semiconductor layer of the second conductivity type.

In another embodiment of the invention, said second semiconductor layer of the second conductivity type which is buried in said first semiconductor substrate of the first conductivity type has a depth which is greater than a depth of said semiconductor layer of the first conductivity type splitting said first semiconductor layer of the second conductivity type.

In still another embodiment of the invention, a depletion layer which extends from said second semiconductor layer of the second conductivity type buried in said semiconductor substrate of the first conductivity type contacts said semiconductor layer of the first conductivity type in at least one point.

In still another embodiment of the invention, a dummy photodiode consisting of said semiconductor substrate of the first conductivity type and said first semiconductor layer of the second conductivity type is formed between adjacent light detecting photodiode portions, and said dummy photodiode portion comprises a second high-density semiconductor layer of the second conductivity type which is buried in said part of said semiconductor substrate of the first conductivity type which constitutes said dummy photodiode portions.

In still another embodiment of the invention, an anode and a cathode of said dummy photodiode portion are short-circuited.

In still another embodiment of the invention, a distance between said semiconductor layer of the first conductivity type and said second high-density semiconductor layer of the second conductivity type in said dummy photodiode portion is smaller than that in said light detecting photodiode portions.

In still another embodiment of the invention, said device comprise a dummy photodiode portion which consists of said semiconductor substrate of the first conductivity type and said semiconductor layer of the first conductivity type and is formed between adjacent light detecting photodiode portions, and said dummy photodiode portion comprises a third high-density semiconductor layer of the second conductivity type which is formed from a surface of said semiconductor layer of the second conductivity type.

In still another embodiment of the invention, an anode and a cathode of said dummy photodiode portion are short-circuited.

In still another embodiment of the invention, an anti-surface-reflection film made of a silicon nitride film is formed on surfaces of said semiconductor regions of the second conductivity type which constitute said light detecting photodiode portions.

In still another embodiment of the invention, an anti-surface-reflection film made of a silicon nitride film is formed on surfaces of said semiconductor regions of the second conductivity type which constitute said light detecting photodiode portions.

According to one aspect of the present invention, the semiconductor layer of the second conductivity type is buried in the part of the semiconductor substrate of the first conductivity type which constitutes split light detecting photodiode portions. Therefore, the semiconductor layer of the second conductivity type is positioned in the vicinity of the semiconductor layer of the first conductivity type which functions as an isolation region for the light detecting photodiode portions and around which optical carriers detour. Consequently, a depletion region is widened along the path in which optical carriers move from positions in the vicinity of the isolation regions to the PN junction plane while detouring around the isolation regions, thereby shortening the distance in which optical carriers are caused to move by diffusion. This improves the response speed obtained when an isolation region for two adjacent light detecting photodiode portions is irradiated with light, and realizes a higher cutoff frequency. Moreover, since the high-density semiconductor layer of the second conductivity type is buried in the dummy photodiode portion, the internal series resistance of the dummy photodiode can be reduced and crosstalk between photodiodes for receiving signal light can be reduced in level.

Furthermore, the PN junction of the dummy photodiode portion can have a depth which is equal to that of the photodiode portions for receiving signal light. Therefore, optical carriers collected in the dummy photodiode portion are increased in number. This is effective in reducing crosstalk. In this case, when the anode and the cathode of the dummy photodiode portion are short-circuited, the width of the dummy photodiode portion can be shortened. In a photodiode for an optical pickup using a hologram device, therefore, crosstalk can be reduced without increasing the width, or the dimension in a direction perpendicular to the longitudinal direction.

The high-density semiconductor layer of the second conductivity type may be formed in the dummy photodiode portion by diffusion from the surface so that the internal series resistance of the dummy photodiode portion is reduced, whereby crosstalk can be reduced. Also in this case, when the anode and the cathode of the dummy photodiode portion are short-circuited, the width of the dummy photodiode portion can be shortened. In a photodiode for an optical pickup using a hologram device, therefore, crosstalk can be reduced without increasing the width.

In the structure wherein the anode and the cathode of the dummy photodiode portion are short-circuited, an anti-surface-reflection film made of a silicon nitride film may be formed on the entire face of the photodiode portions for receiving signal light. Consequently, the anti-reflection film is not required to have a mask aligning margin between adjacent photodiode portions. While maintaining a small width of the photodiode, therefore, crosstalk can be reduced without increasing the surface reflectivity in the vicinity of the photodiode for receiving signal light.

Thus, the invention described herein makes possible the advantages of (1) providing a light receiving device in which the deterioration of the response speed under the state where an isolation region for separating adjacent light detecting portions from each other is irradiated with a light beam can be improved, (2) providing a light receiving device which has a higher cutoff frequency, (3) providing a light receiving device in which the focusing of the optical pickup can be correctly conducted even when the semiconductor layers are somewhat deviated positionally, and (4) providing a light receiving device having decreased crosstalk.

These and other advantages of the present invention will become apparent to these skilled in the art upon reading and understanding the following detailed description with reference to the accompanying figures.

BRIEF DESCRIPTION OF THE DRAWINGS

FIG. 1 is a cross-sectional view of a structure of a split photodiode (light receiving device) according to a first embodiment of the invention.

FIG. 7 is a diagram showing the light beam position dependency of the cutoff frequency of the conventional split photodiode.

FIG. 10 is a diagram showing the light beam position dependency of the cutoff frequency of the split photodiode of the first embodiment.

FIG. 16 is a cross-sectional view illustrating a countermeasure to problems of the first embodiment.

FIG. 17 is a cross-sectional view showing a split photodiode (light receiving device) of a second embodiment of the invention.

DESCRIPTION OF THE PREFERRED EMBODIMENTS

Figure 2A:
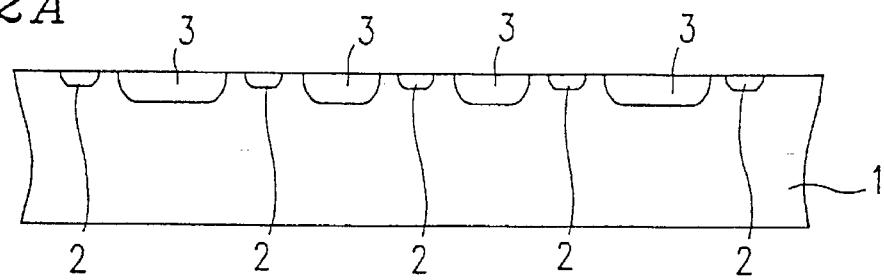
FIGS. 2A to 2D are cross-sectional views of the structure of the split photodiode of FIG. 1 at periodic stages of the formation process.

Hereinafter, the present invention will be described by way of illustrative embodiments with reference to the accompanying drawings. Components having identical functions are indicated by the same reference numerals.

Embodiment 1

FIG. 1 shows a cross-section of a split photodiode which is a light receiving device according to a first embodiment of the invention. In the figure, components formed in steps conducted after the step of processing metal conductors, such as multi-layer conductors, a passivation film, and the like are not shown. In the figure, 1 designates a P-type semiconductor substrate, and an N-type epitaxial layer 4 is formed on the substrate. In the N-type epitaxial layer 4, P-type isolation diffusion layers 5 are formed so as to extend from the surface of the epitaxial layer 4, and P-type buried diffusion layers 2 are formed in the portions of the surface of the substrate 1 which oppose the diffusion layers 5, thereby splitting the layer 4 into plural regions. The split N-type semiconductor regions and the substrate portions below the regions constitute light detecting photodiode portions D1 to D5 for detecting signal light. N-type buried diffusion layers 3 are formed in the portions of the substrate 1 constituting the light detecting photodiode portions. Each N-type buried diffusion layer 3 is formed at a position which is separated from the respective P-type buried isolation diffusion layers 2 by a distance shorter than a route from a point of the outer periphery of the isolation diffusion layer 2 to the N-type epitaxial layer 4, the route including with detouring around the diffusion layer.

Next, a method of producing the light receiving device having the above-mentioned structure will be described with reference to FIGS. 2A to 2D.

First, as shown in FIG. 2A, the N-type buried diffusion layers 3 are formed in parts or portions of, for example, the P-type silicon substrate 1, where the light detecting photodiode portions are to be formed (photodiode formation regions). The P-type buried isolation diffusion layers 2 are formed in regions of the substrate 1 which are to be formed as the isolation regions for the light detecting photodiode portions.

Figure 2B:
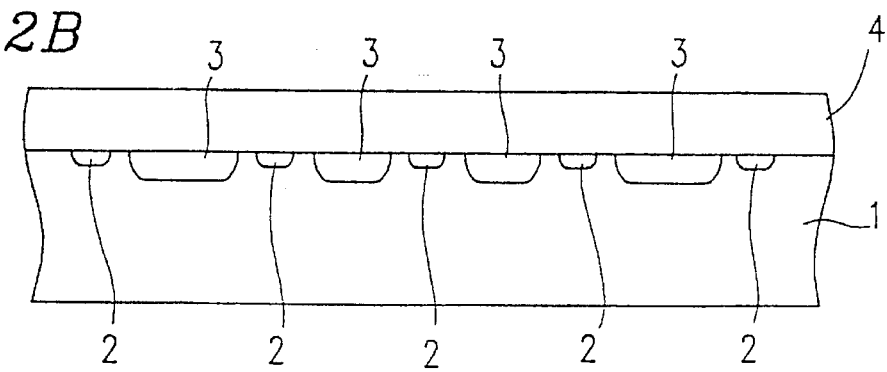
Figure 2C:
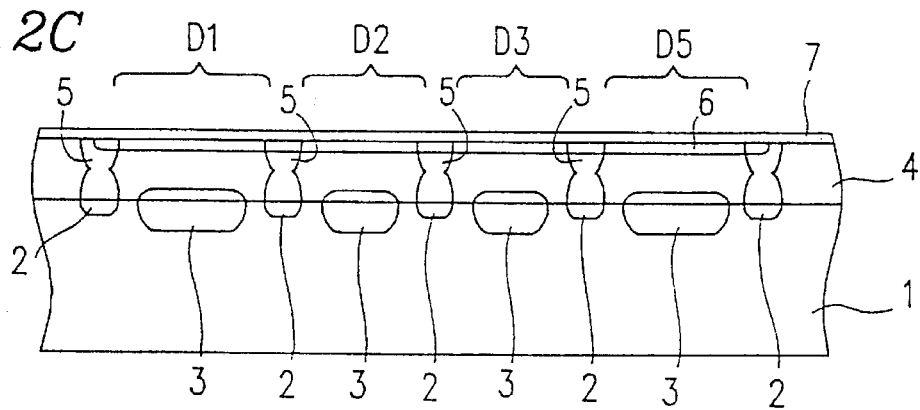

In the same manner as the prior art example, the N-type epitaxial layer 4 is then grown on the entire face of the P-type silicon substrate 1, as shown in FIG. 2B. Thereafter, P-type isolation diffusion layers 5 are formed in regions running from the surface of the N-type epitaxial layer 4 and corresponding to the P-type buried isolation diffusion layers 2. A P-type diffusion layer 6 is then formed on the surface of the N-type epitaxial layer 4 constituting split photodiodes D1, D2, D3, and D5, and also on the surfaces of the P-type diffusion layers 5 which will be formed as the isolation regions for the split photodiode (FIG. 2C).

Figure 2D:
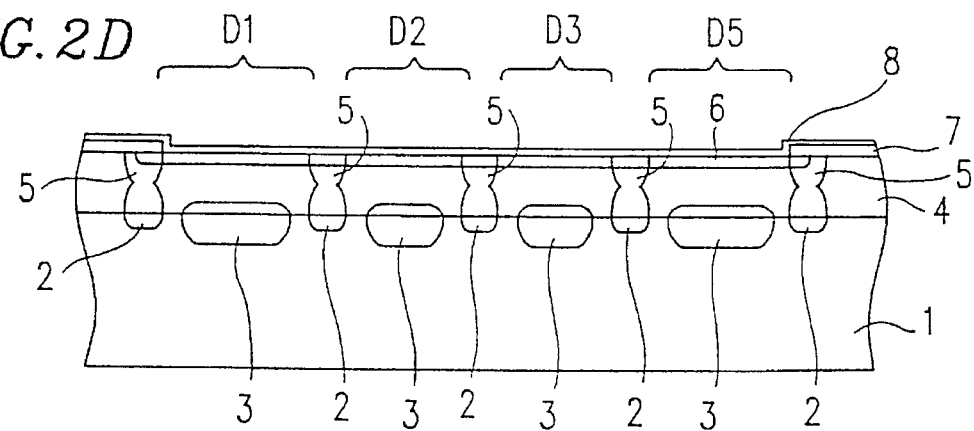

During the process of forming the P-type diffusion layer 6, a silicon oxide film 7 is formed on the surfaces of the P-type diffusion layer 6 and the N-type epitaxial layer 4. The portion of the silicon oxide film 7 corresponding to the light receiving region of the surface of the P-type diffusion layer 6 is removed away. Then, a silicon nitride film 8 is formed on the entire surface. In order that the silicon nitride film 8 function as an anti-reflection film, the thickness of the nitride film is selected so as to correspond to the wavelength of the laser diode (FIG. 2D).

Next, electrode windows are opened in the oxide film 7 and the nitride film 8. Electrode conductors 9a are formed, and at the same time, metal films 9 are formed through the silicon nitride film 8 and the oxide film 7 on the isolation regions for light detecting photodiode portions which are not irradiated with signal light, thereby obtaining the light receiving device having the structure shown in FIG. 1. A signal processing circuit (not shown) is formed on the semiconductor substrate 1 by a usual bipolar IC process.

Figure 11:
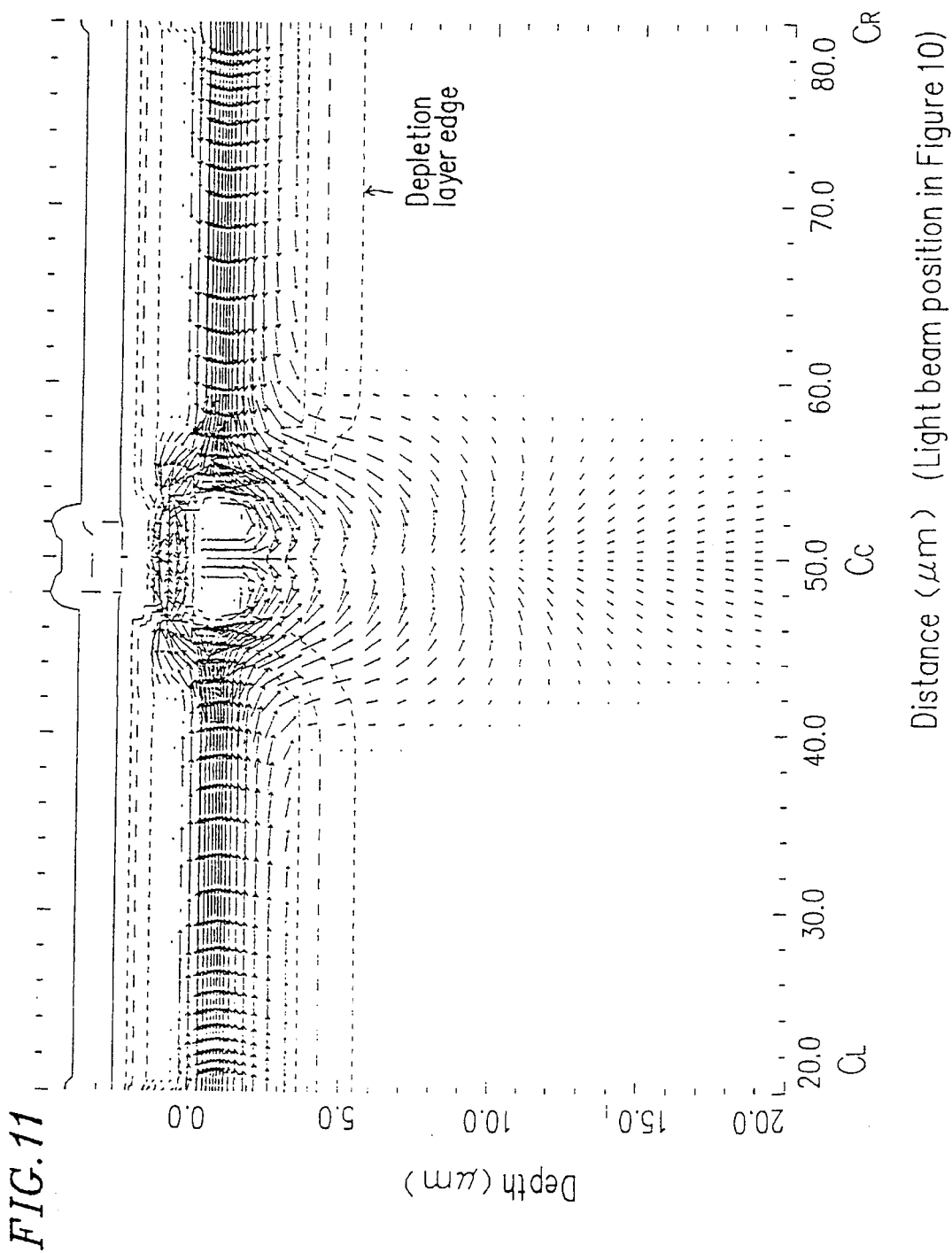
FIG. 11 is a diagram showing results obtained when the state where an isolation region of light detecting portions of the split photodiode of the first embodiment irradiated with a light beam was analyzed using a device simulation system.

FIG. 10 shows the light beam position dependency of the cutoff frequency of the thus configured split photodiode. FIG. 11 shows results of simulation of movements of optical carriers in the photodiode having the above-mentioned structure. In FIG. 11, directions of currents are indicated by arrows. Electrons which function as optical carriers move in directions opposite to those of the arrows.

As seen from FIGS. 10 and 11, the N-type buried diffusion layers 3 are positioned in the vicinity of the P-type buried isolation diffusion layers 2 which are the isolation regions for the light detecting photodiode portions and around which optical carriers detour. Consequently, a depletion region is widened along the path in which, when the isolation regions for the light detecting photodiode portions are irradiated with a light beam, optical carriers move from positions in the vicinity of the isolation regions to the PN junction plane while detouring around the isolation regions. In this manner, the distance in which optical carriers are caused to move by diffusion is shortened. Specifically, the distance is reduced from the order of 10 micrometers to the order of 1 micrometers, and the cutoff frequency characteristics is improved.

Furthermore, this structure allows the junction to be positioned at a deeper level than that in the prior art. Therefore, the distance in which optical carriers are caused to move in the depth direction by diffusion is shortened, and also the cutoff frequency characteristics obtained when light beam irradiates a portion other than the isolation regions is improved.

When the N-type buried diffusion layers 3 are formed at a deeper level than the P-type buried isolation diffusion layers 2, the distance in which detouring optical carriers are caused to move by diffusion can be shortened, and hence a larger effect mentioned above is attained. The N-type buried diffusion layers 3 may be formed simultaneously with N-type buried diffusion layers of the signal processing circuit, or may be formed not simultaneously.

The deterioration of properties due to variations of the optical split positions of the photodiodes, i.e., the position of a light beam where the optical sensitivities at the light detecting photodiode portions D2 and D3 are equal to each other, can be suppressed by restricting the distance between the N-type buried diffusion layers 3 and the P-type buried isolation diffusion layers 2. This will be described in detail below.

The distance between the N-type buried diffusion layers 3 and the P-type buried isolation diffusion layers 2 is set so that when a normal power source voltage is applied, the depletion layers from the N-type buried diffusion layers 3 do not contact the P-type buried isolation diffusion layers 2 in the signal processing circuit region, or the distance is increased. This is conducted in order to maintain the breakdown voltage at the PN junction high enough and also to prevent the junction capacitance from being increased.

For example, the specific resistance of the P-type silicon substrate 1 is set to be 15 Ωm, the final lateral diffusion spread of the N-type buried diffusion layers 3 (hereinafter, the lateral diffusion spread means the dimension of the portion protruding from the diffusion window) is set to be 3 μm, the lateral diffusion spread of the P-type buried isolation diffusion layers 2 is set to be 1 μm, and the alignment variation of the N-type buried diffusion layers 3 and the P-type buried isolation diffusion layers 2 is set to be 1 μm.

In this case, the interval of the opening patterns of the mask for the N-type buried diffusion layers 3 and the P-type buried isolation diffusion layers 2 is set to be equal to or greater than 8.4 μm which is a total of the thickness (3.4 μm) of the depletion layer extending from the N-type buried diffusion layer 2 to the P-type silicon substrate 1 when the power source voltage is 5 V, the diffusion spread, and the alignment variation.

Figure 12A:
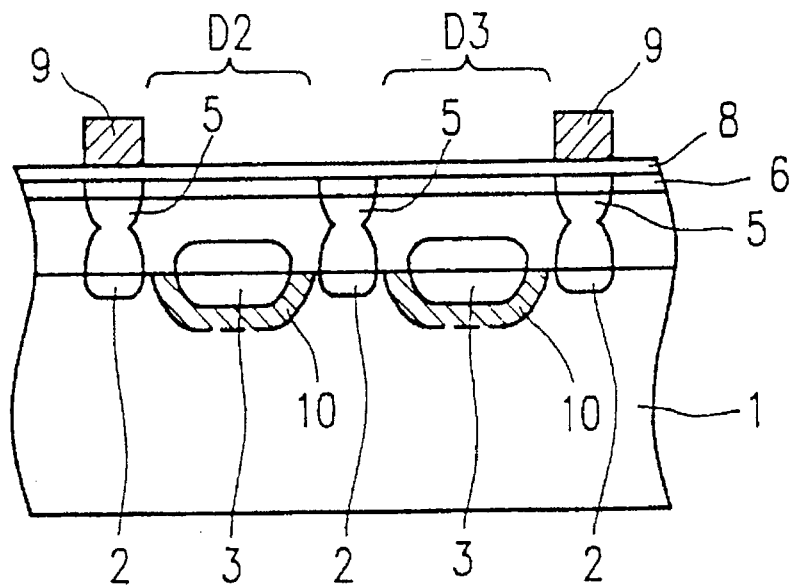
FIG. 12A is a cross-sectional view showing a structure of light detecting photodiode portions D2 and D3 obtained when the distance between an N-type buried diffusion layer 3 and P-type buried isolation diffusion layer 2 is equal to the distance in a signal processing circuit region in the first embodiment.
Figure 12B:
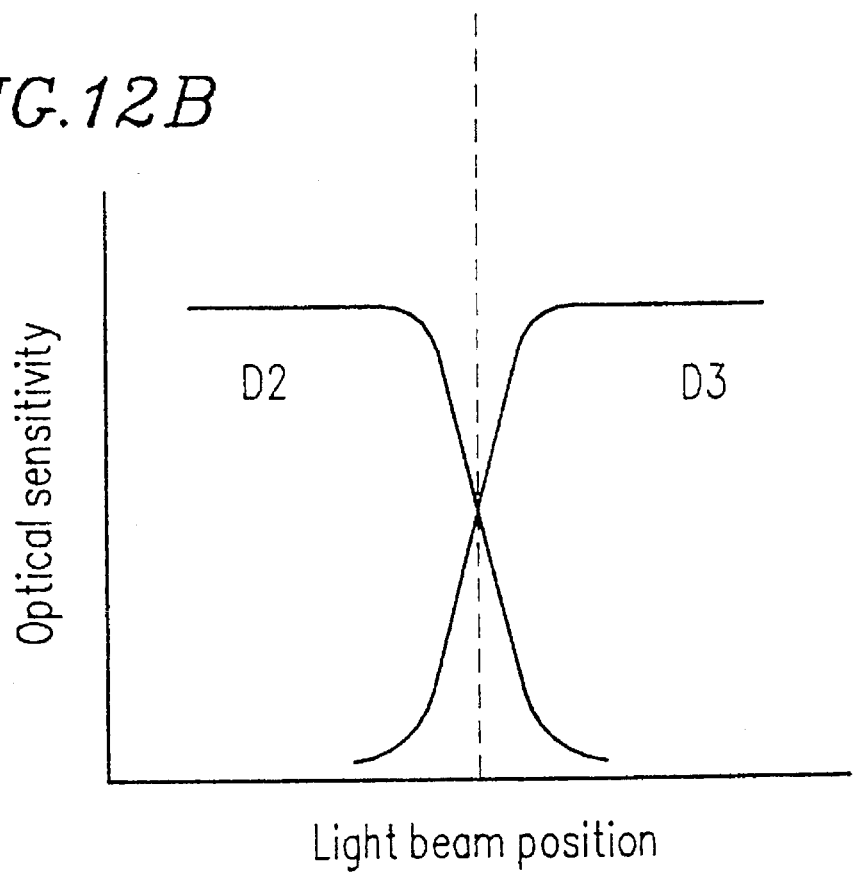
FIG. 12B is a profile of the optical sensitivity in the light detecting photodiode portions.

FIG. 12A shows a cross-section of the structure of the main portion of the light detecting photodiode portions D2 and D3. this structure is obtained when the pattern interval in the light receiving portion is equal for the N-type buried diffusion layers 3 and the P-type buried isolation diffusion layers 2 in the signal processing circuit region. A broken line 10 indicates the spread of the depletion layer. FIG. 12B shows the profile of the optical sensitivity in the light detecting photodiode portions having the structure of FIG. 12A. As shown, when the P-type buried diffusion layer 2 and the N-type buried diffusion layers 3 are not misaligned, the optical split position coincides with the position of the P-type buried isolation diffusion layer 2.

Figure 13A:
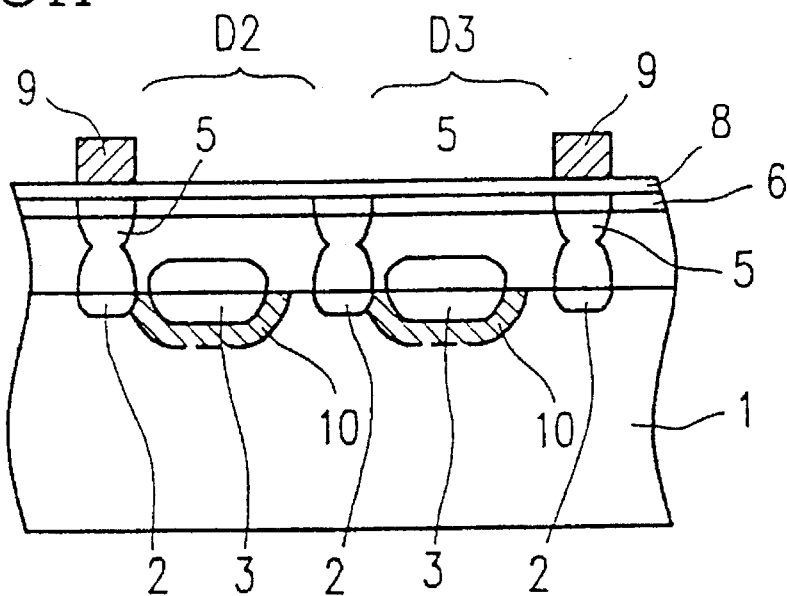
FIG. 13A is a cross-sectional view showing a structure of light detecting photodiode portions D2 and D3 obtained when a misalignment occurs between the N-type buried diffusion layer 3 and the P-type buried isolation diffusion layer 2 in the structure shown in FIG. 12.
Figure 13B:
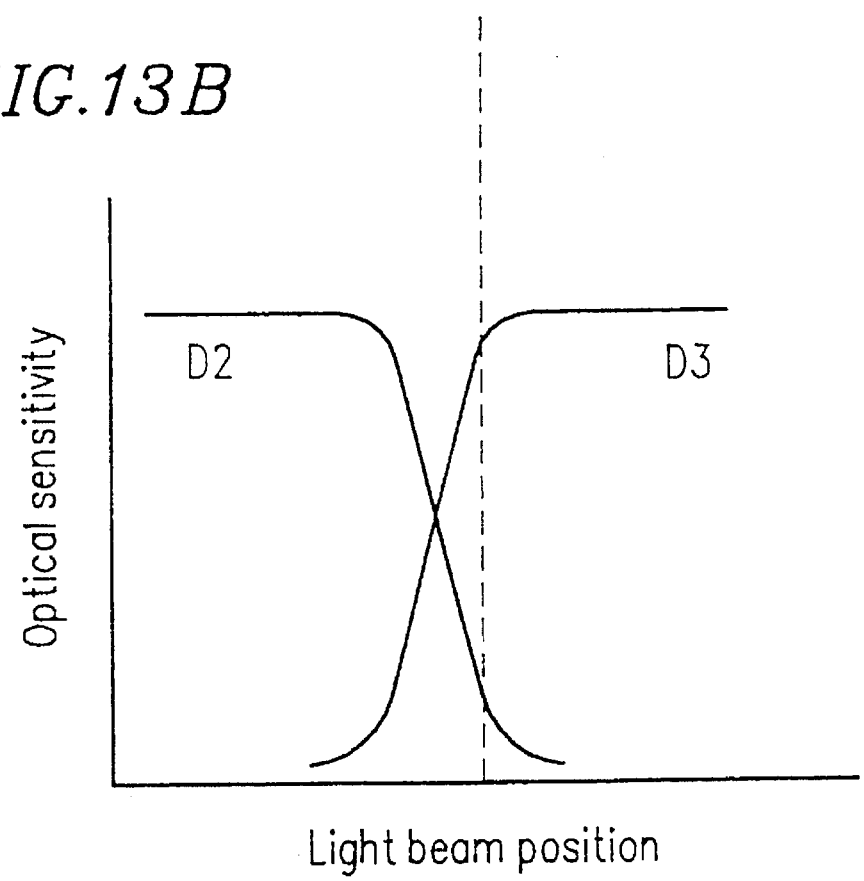
FIG. 13B is a profile of the optical sensitivity in the light detecting photodiode portions.

FIG. 13A shows a section structure obtained when a misalignment occurs, and FIG. 13B shows the profile of the optical sensitivity in the light detecting photodiode portions having this structure. The positions of the edges of the depletion layers are laterally asymmetric with respect to the buried diffusion layer 2, and hence the optical split position fails to coincide with the position of the P-type buried isolation diffusion layer 2. Even when a light beam impinges the position of the P-type buried diffusion layer 2 between the light detecting photodiode portions D2 and D3, the photocurrents of the light detecting photodiode portions D2 and D3 are different from each other because their optical positions are shifted from each other. This produces a problem in that the focus error signal due to the difference in photocurrent cannot be obtained correctly.

When the pattern interval of the P-type buried isolation diffusion layers 2 and the N-type buried diffusion layers 3 is set to be smaller than the alignment variation, the N-type buried diffusion layers 3 may overlap with the P-type buried diffusion layers 2. In such a case, there arise problems of a large increase in the capacitance, and reduction of the breakdown voltage at the PN junction.

The above-mentioned problems are prevented by setting the final interval d between the N-type buried diffusion layers 3 and the P-type buried isolation diffusion layer 2 so as to satisfy the following conditions:

$$\Delta \leq d \leq \Delta + dx$$

where $\Delta$ is an alignment variation; and $dx$ is a width of the depletion layer extending from the N-type buried diffusion layer 3 toward the P-type silicon substrate 1.

For example, the specific resistance of the P-type silicon substrate 1 is set to be 15 Ωcm, the final lateral diffusion spread of the N-type buried diffusion layers 3 is set to be 3 μm, the lateral diffusion spread of the P-type buried isolation diffusion layers 2 is set to be 1 μm, the width of the depletion layer extending between the N-type buried diffusion layer 3 and the P-type silicon substrate 1 when a reverse bias voltage of 1.0 V is applied across the N-type buried diffusion layer 3 and the P-type silicon substrate 1 is set to be 1.8 μm, and the alignment variation of the N-type buried diffusion layers 3 and the P-type buried isolation diffusion layers 2 is set to be 1 μm. In this case, the distance d is set so that the following conditions are satisfied:

$$1.0 \leq d \leq 1.0 + 1.8 (\mu m)$$

In the case where an increase of the junction capacitance or the like does not produce a serious problem, it is required to satisfy only the condition of $d \leq A+dx$.

Figure 14A:
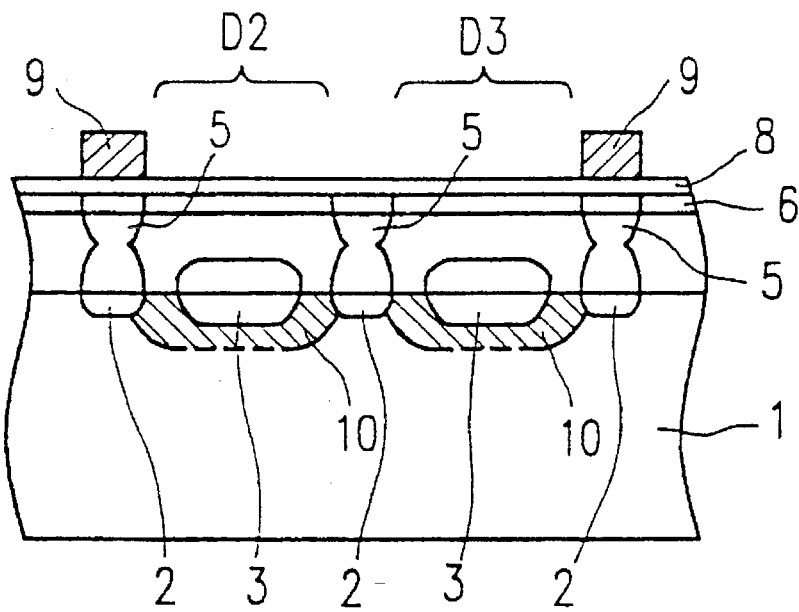
FIG. 14A is a cross-sectional view showing a structure of the light detecting photodiode portions D2 and D3 obtained when the distance d between the N-type buried diffusion layer 2 and the P-type buried isolation diffusion layer 3 is restricted in the first embodiment.
Figure 14B:
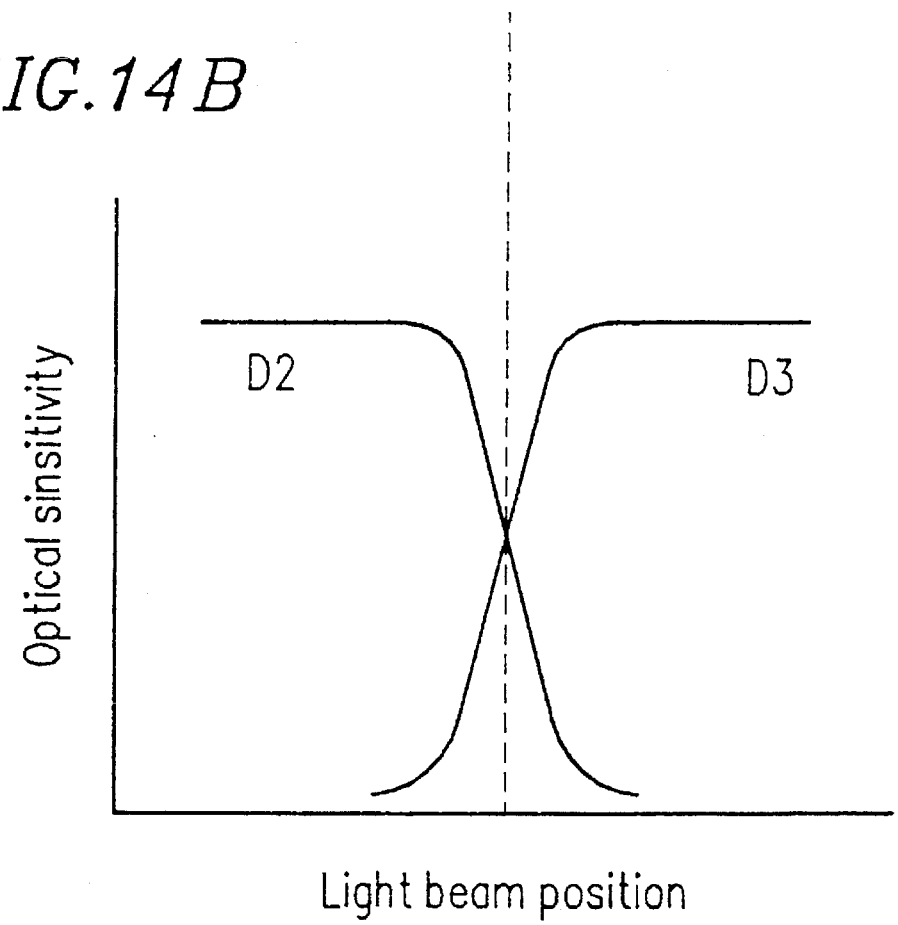
FIG. 14B is a profile of the optical sensitivity in the light detecting photodiode portions.
Figure 15A:
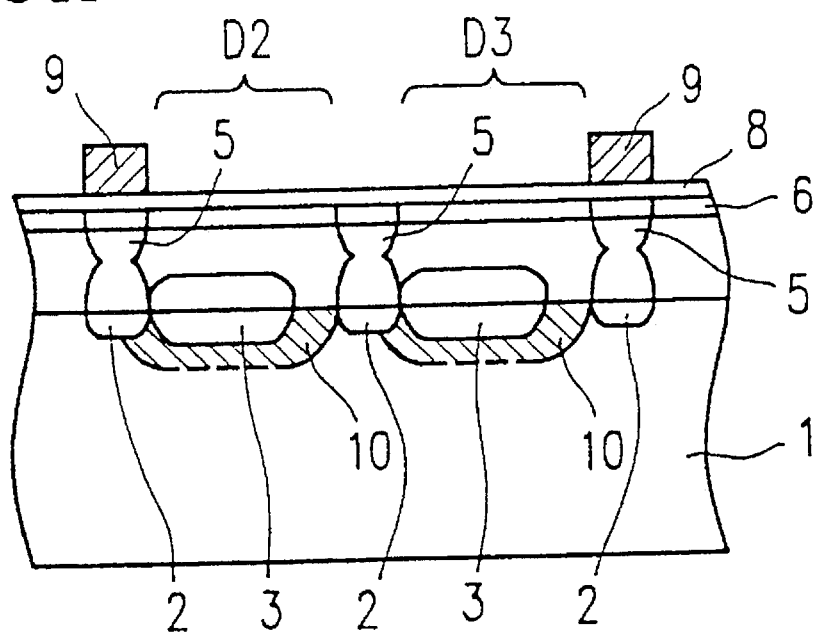
FIG. 15A is a cross-sectional view showing a structure of light detecting photodiode portions D2 and D3 obtained when a misalignment occurs between the N-type buried diffusion layer 3 and the P-type buried isolation diffusion layer 2 in the structure shown in FIG. 14.
Figure 15B:
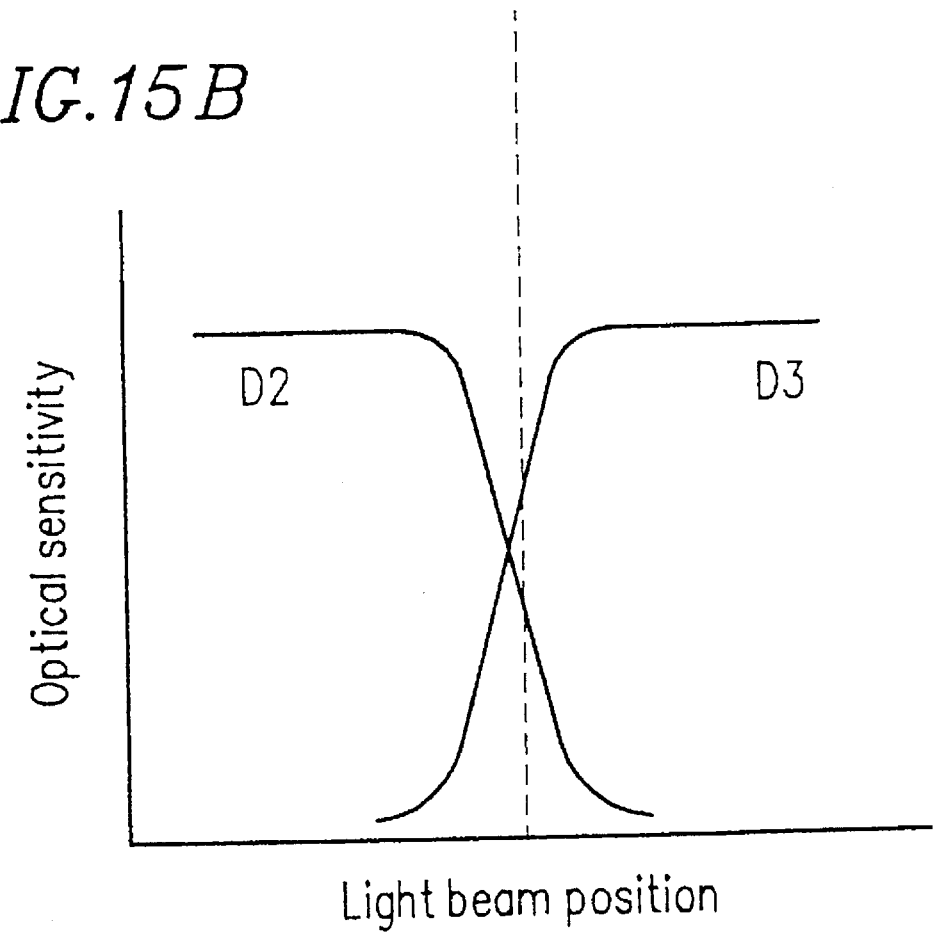
FIG. 15B is a profile of the optical sensitivity in the light detecting photodiode portions.

In other words, the pattern interval between the N-type buried diffusion layer and the P-type buried isolation diffusion layer is set to be 5.0 to 6.8 µm. FIG. 14A shows a cross-section of a structure of the main portion of the light detecting photodiode portions D2 and D3 which are configured as described above and in the case where no alignment variation occurs. FIG. 14B shows the profile of the optical sensitivity in the light detecting photodiode portions having the structure of FIG. 14A. FIG. 15A shows a cross-section of a structure of the main portion of the light detecting photodiode portions D2 and D3 which are configured as described above and in the case where alignment variations occur. FIG. 15B shows the profile of the optical sensitivity in the light detecting photodiode portions having the structure of FIG. 15A.

Even when alignment variations occur, the depletion layer extending from the N-type buried diffusion layers 3 reach the P-type buried isolation diffusion layers 2 on both lateral sides. Therefore, the optical split position substantially coincides with the position of the P-type buried isolation diffusion layer 2, and the focus error signal can be obtained correctly.

Since the N-type buried diffusion layers 3 do not contact the P-type buried isolation diffusion layers 2, an increase of the capacitance and reduction in the breakdown voltage at the PN junction do not occur.

The embodiment in which the P-type buried isolation diffusion layers 2 are used as isolation regions for the light detecting photodiode portions has been described. Alternatively, the isolation regions may be configured only by isolation diffusion layers which are formed by diffusion from the surface, or an isolation structure using another semiconductor layer may be employed.

Embodiment 2

Figure 5:
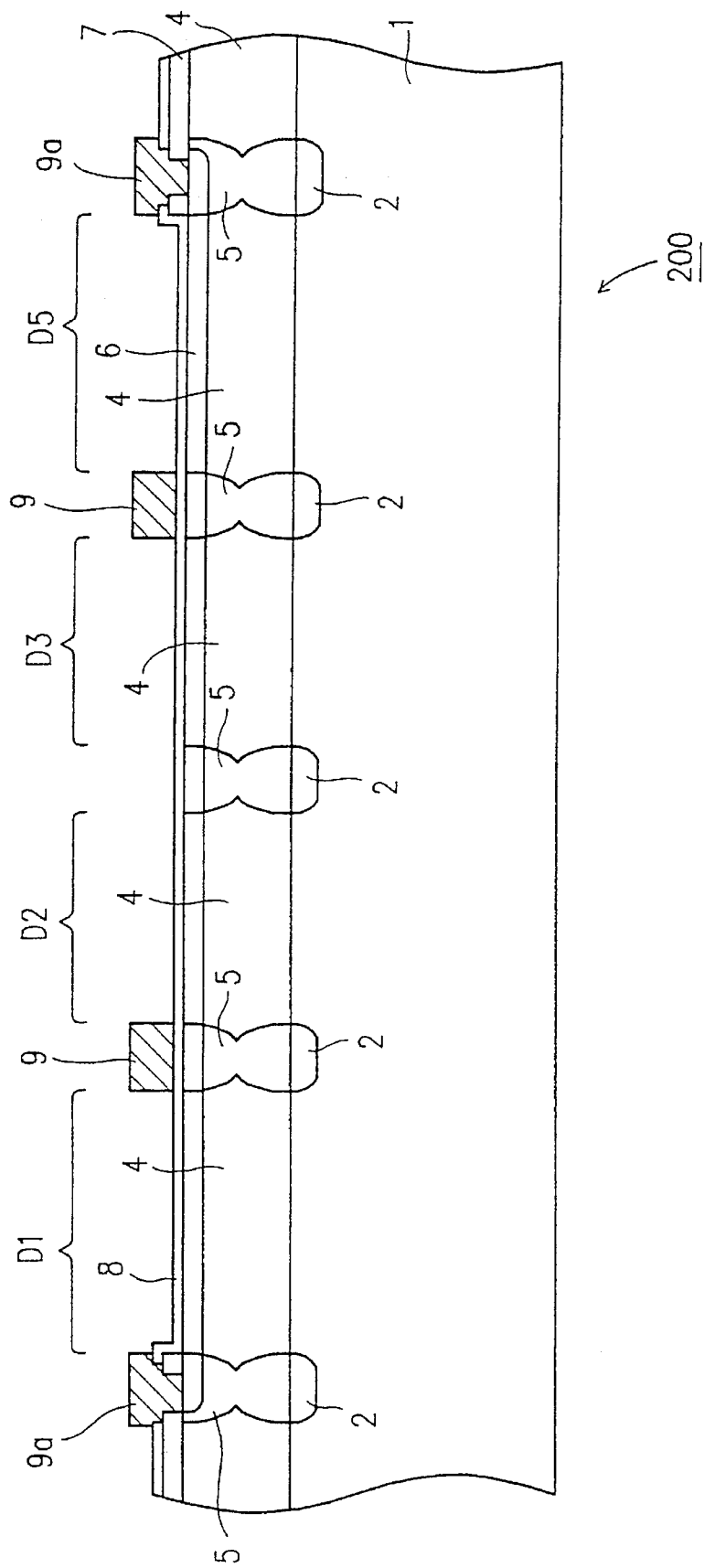
FIG. 5 is a cross-sectional view along line a–a' of the conventional split photodiode shown in FIG. 4.
Figure 6A:
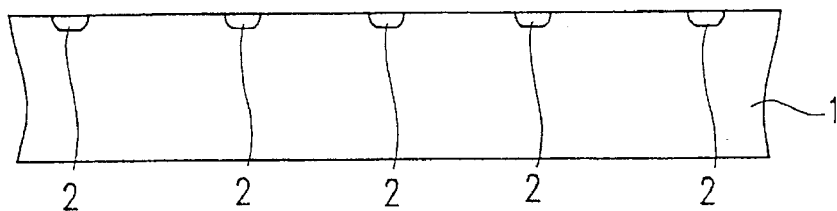
FIGS. 6A to 6D are cross-sectional views of the structure of the conventional split photodiode at periodic stages of the formation process.
Figure 6B:
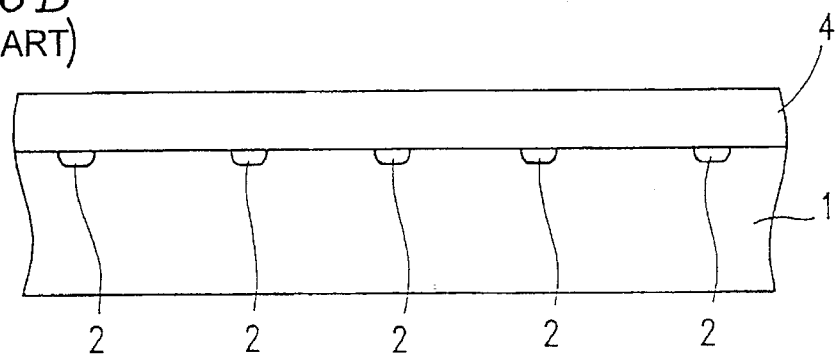
Figure 6C:
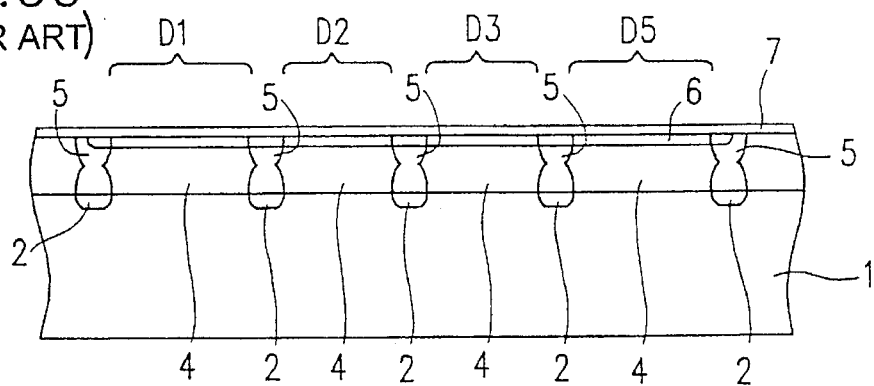
Figure 6D:
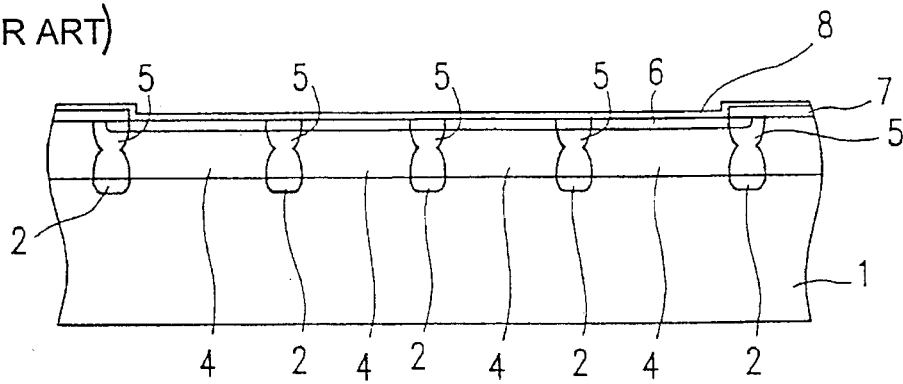
Figure 8:
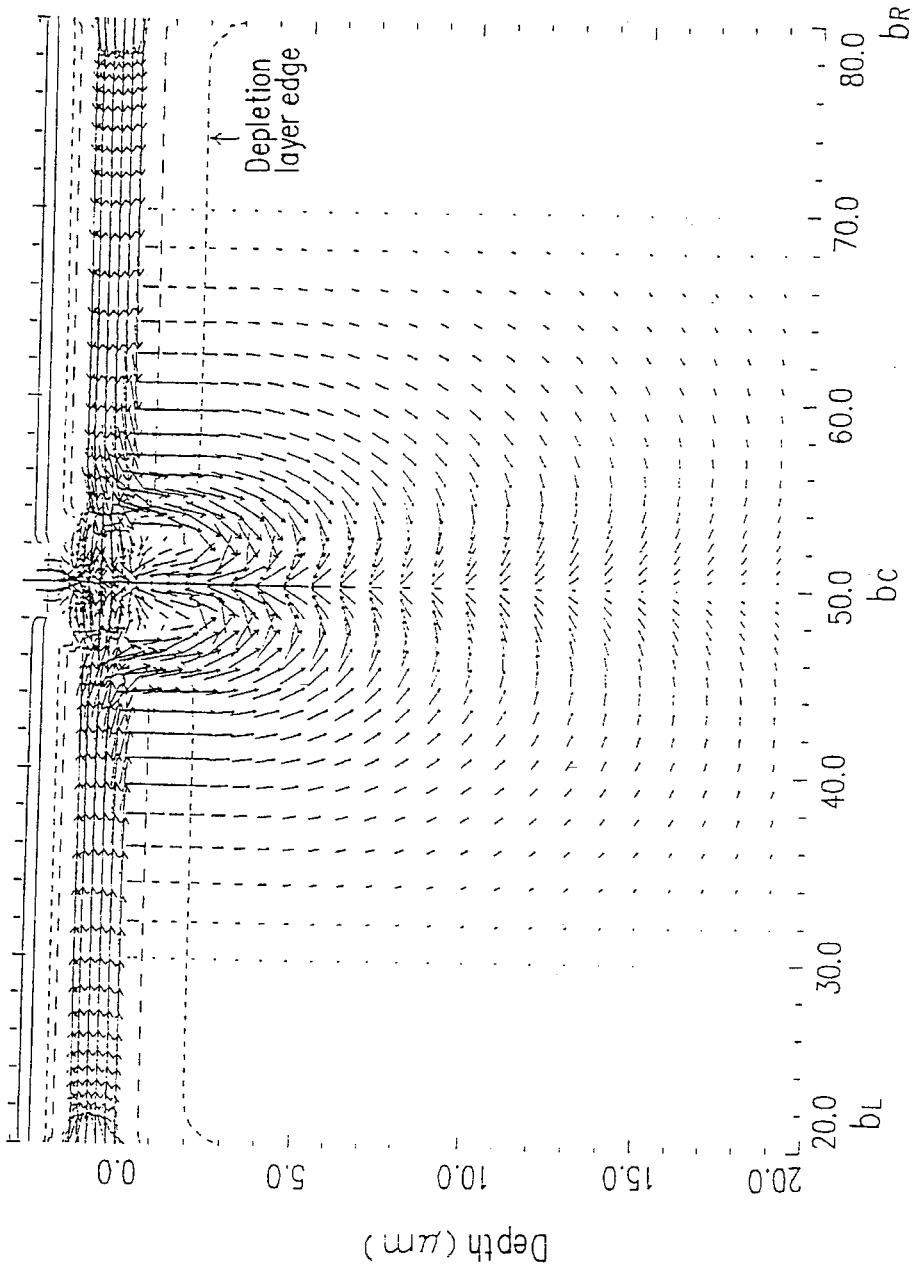
FIG. 8 is a diagram showing results obtained when the state where an isolation region of light detecting portions irradiated with a light beam was analyzed using a device simulation system.
Figure 9:
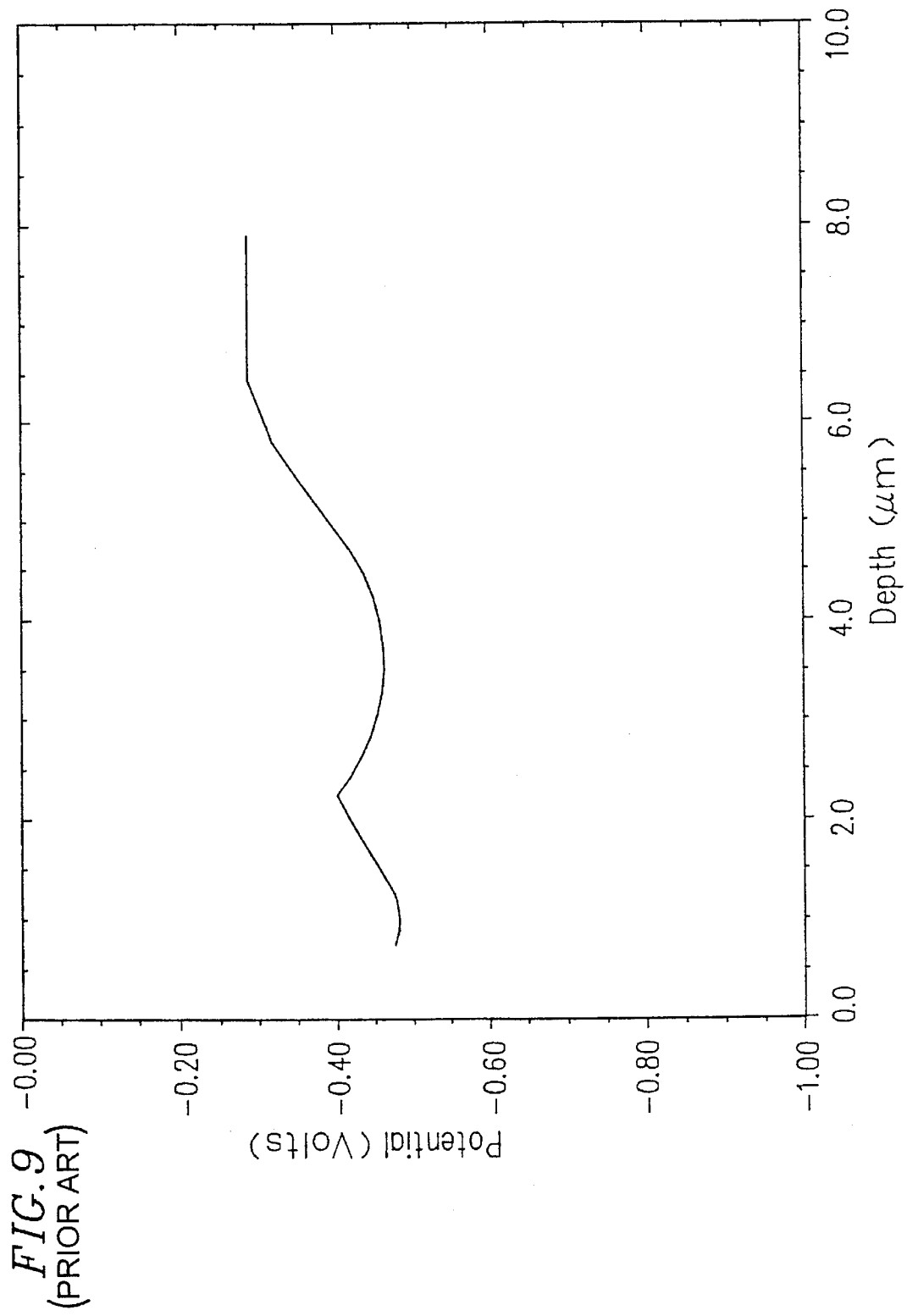
FIG. 9 is a graph showing the potential distribution in the vicinity of the isolation region of the light detecting portions.

In conventional split photodiodes, such as the one shown in FIG. 5, one of the important properties is crosstalk which indicates the degree of interference between light signals of adjacent light detecting photodiode portions. It is desirable that crosstalk has a value which is as small as possible. As the distance between a position where optical carriers are generated and the PN junction of each split photodiode decreases, the occurrence of crosstalk increases in level. Accordingly, reduction of crosstalk can be conducted effectively by increasing the distance between junctions of adjacent light detecting photodiode portions to a value as large as possible.

When the N-type buried diffusion layers 3 are formed in the light detecting photodiode portions as shown in Embodiment 1 of FIG. 1, however, the distance between PN junctions of adjacent light detecting photodiode portions is small, and hence there arises a problem in that crosstalk increases. This problem can be solved effectively by a structure in which a photodiode called a dummy photodiode is formed between adjacent light detecting photodiode portions, and optical carriers generated in an end portion of a light detecting photodiode portion and directed to an adjacent light detecting photodiode portion are collected by the dummy photodiode portion, thereby preventing the optical carriers from contributing to the photocurrent of the adjacent light detecting photodiode portion.

FIG. 16 shows a cross-section of a structure of a light receiving device having such a structure. In the FIG. 101*a* designates a split photodiode in which a dummy photodiode portion is added to the structure of the split photodiode shown in FIG. 4. In the light receiving device 101*a*, dummy photodiodes DD1 and DD2 are disposed between the photodiodes D1 and D2, and D3 and D5, respectively.

In a dummy photodiode portion having such a structure, however, the dummy photodiode portion has a large internal series resistance and the operation speed is low. With respect to a light signal which is modulated by a high-frequency signal, therefore, the dummy photodiode portion does not function as a dummy photodiode. When the dummy photodiode portion has a width of 10 µm and a length of 700 µm and the epitaxial layer has a specific resistance of 1 Ωcm and an effective thickness of 2 µm, for example, the series resistance in the cathode side of the dummy photodiode portion can be calculated as follows:

$$1(\Omega cm) \times 700E{-}4(cm)/\{10E{-}4(cm) \times 2E{-}4(cm)\} = 350(k\Omega)$$

Hereinafter, "E–4" in equations, for example, means "10 to the (–4)th power". It is assumed that a portion of 20 µm in the depth direction of the substrate contributes to the resistance, the distance between the dummy photodiode portion and the anode electrode is 100 µm, the length of the dummy photodiode portion is 700 µm, and the substrate has a specific resistance of 10Ωcm. In this case, the series resistance in the anode side of the dummy photodiode portion can be calculated as follows:

$$10(\Omega cm) \times 100E{-}4(cm)/\{700E{-}4(cm) \times 20E{-}4(cm)\} \approx 714(\Omega)$$

From these results, it will be noted that the internal series resistance of the dummy photodiode portion mainly consists of the series resistance of the cathode side and has a very large value. The junction capacitance of the dummy photodiode portion is estimated to be 0.25 (pF). Accordingly, the cutoff frequency determined by the CR time constant of the dummy photodiode portion is obtained as follows:

$$1/\{2 \times \pi \times 0.25E{-}12(F) \times 350E3(\Omega)\} \approx 1.8 \text{ (MHz)}$$

As seen from this result, when the modulation frequency of signal light is higher than 1.8 MHz, the dummy photodiode portion does not function as a dummy photodiode.

Figure 18:
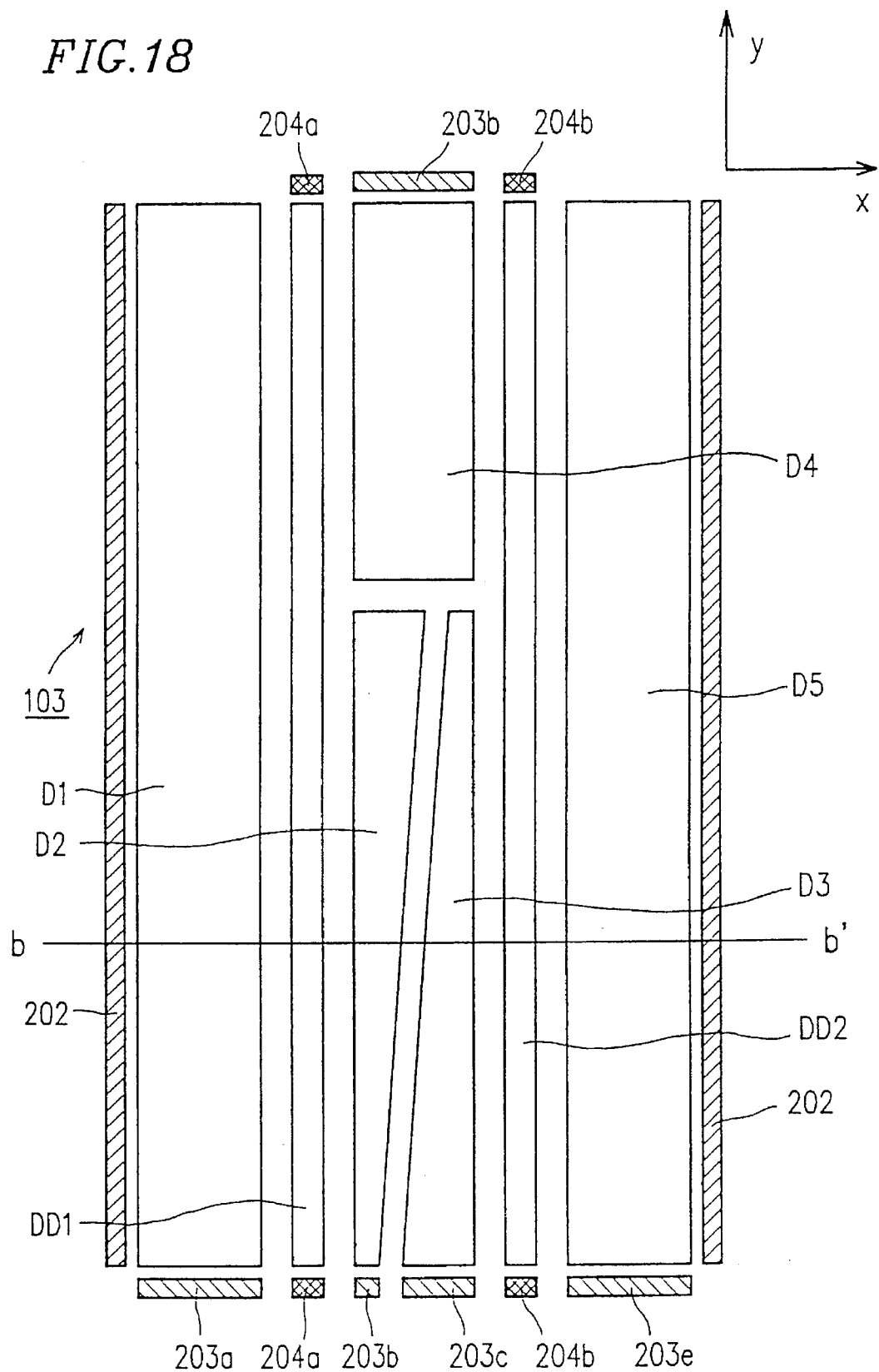
FIG. 18 is a plan view showing the split photodiode (light receiving device) of the second embodiment of the invention.

FIG. 18 is a plan view showing the structure of a split photodiode which is a light receiving device according to a second embodiment of the invention and in which the above-discussed defect is improved, and FIG. 17 is a section view along line b–b' of the figure. In the figures, 102 designates the split photodiode of the embodiment in which an N-type buried diffusion layer 3*a* is added to the dummy photodiode portion of the split photodiode shown in FIG. 16. The employment of this structure allows the dummy photodiode portion to have a reduced internal series resistance, so that the dummy photodiode portion can operate as a dummy photodiode with respect to a light signal which is modulated by a high-frequency signal.

The series resistance of the cathode side of the structure in which the N-type buried diffusion layer 3*a* is disposed can be calculated in the following manner. In this calculation, it is assumed that the sheet resistance of the N-type buried diffusion layer 3 is 20 Ω/□, and the diffusion width is 5 µm.

$$20(\Omega/\square) \times 700(\mu m)/5(\mu m) = 2.8(k\Omega)$$

As seen from this result, the provision of the N-type buried diffusion layer 3*a* allows the series resistance of the cathode side to be reduced to about 1/100 of its value without the diffusion layer 3*a*. In this case, the cutoff frequency which is determined by the CR time constant of the dummy photodiode portion is as follows:

$$1/\{2\times\pi\times0.25\text{E}-12(\text{pF})\times(2.8+0.7)\ (\text{k}\Omega)\}\approx 182(\text{MHz})$$

In the frequency region (below 30 MHz) which is usually used, therefore, the dummy photodiode can operate without any problem.

However, the provision of the N-type buried diffusion layer 3a in the dummy photodiode portion causes the dummy photodiode to be wider than that of the structure shown in FIG. 16. This produces a problem in that the pitch in the width direction (X-direction) of segments (dummy photodiode portions) of the split photodiode is increased.

As described above, when the interval of the three laser beams arranged in the X-direction is large, the adjustment in the process of incorporating an optical pickup in an optical disk apparatus is difficult. Therefore, the segment pitch in the X-direction of the photodiode must be minimized. However, the formation of the N-type buried diffusion layer 3a in the dummy photodiode portion which is conducted under the same design rule as that for the photodiode portions for receiving signal light is contrary to the demand that the segment pitch in the X-direction of the photodiode in an optical pickup using a hologram device be small.

In the photodiode portions for receiving signal light, as described above, the N-type buried diffusion layer 3 and the P-type buried isolation diffusion layers 2 must be separated from each other by 5.0 μm to 6.8 μm by means of the interval of the diffusion windows. When the design rule for the photodiode portions for receiving signal light is employed so that the N-type buried diffusion layer 3 has a width of 5 μm, therefore, the width (distance between the P-type buried isolation diffusion layers) of the dummy photodiode is 15.0 μm to 18.6 μm.

In contrast, according to this embodiment, the cathode and the anode in each of the dummy photodiodes DD1 and DD2 are short-circuited by a short-circuit electrode 204a or 204b so that the distance between the N-type buried diffusion layer 3a and the P-type buried isolation diffusion layers 2 is set to be smaller than the width of the photodiode portions for receiving signal light. In the case where the breakdown voltage at the PN junction is not required to be maintained high, even when the distance between the N-type buried diffusion layer 3a and the P-type buried isolation diffusion layers 2 is so small that, when a misalignment occurred, they contact each other, no problem arises so long as the N-type buried diffusion layer 3a does not protrude beyond the P-type buried isolation diffusion layers 2 to reach the region of the photodiode portion for receiving signal light. When the width of the diffusion window for the P-type buried isolation diffusion layers 2 is set to be 4 μm, the lateral spread of the N-type buried diffusion layer 3a is set to be 3 μm, and mask misalignment between the P-type buried isolation diffusion layers 32 and the N-type buried diffusion layer 3a is set to be 1 μm, the minimum design value of the interval of the diffusion windows which is necessary for preventing the N-type buried diffusion layer 3a from protruding beyond the high-density region (diffusion window portion) of the P-type buried isolation diffusion layers 2 is obtained as follows:

$$3(\mu\text{m})+1(\mu\text{m})-4(\mu\text{m})=0(\mu\text{m})$$

In other words, when the width (width of the diffusion window portion) of the N-type buried diffusion layer 3 is 5 μm, the width of the dummy photodiode portions can be set to 5 μm.

Embodiment 3

Figure 19:
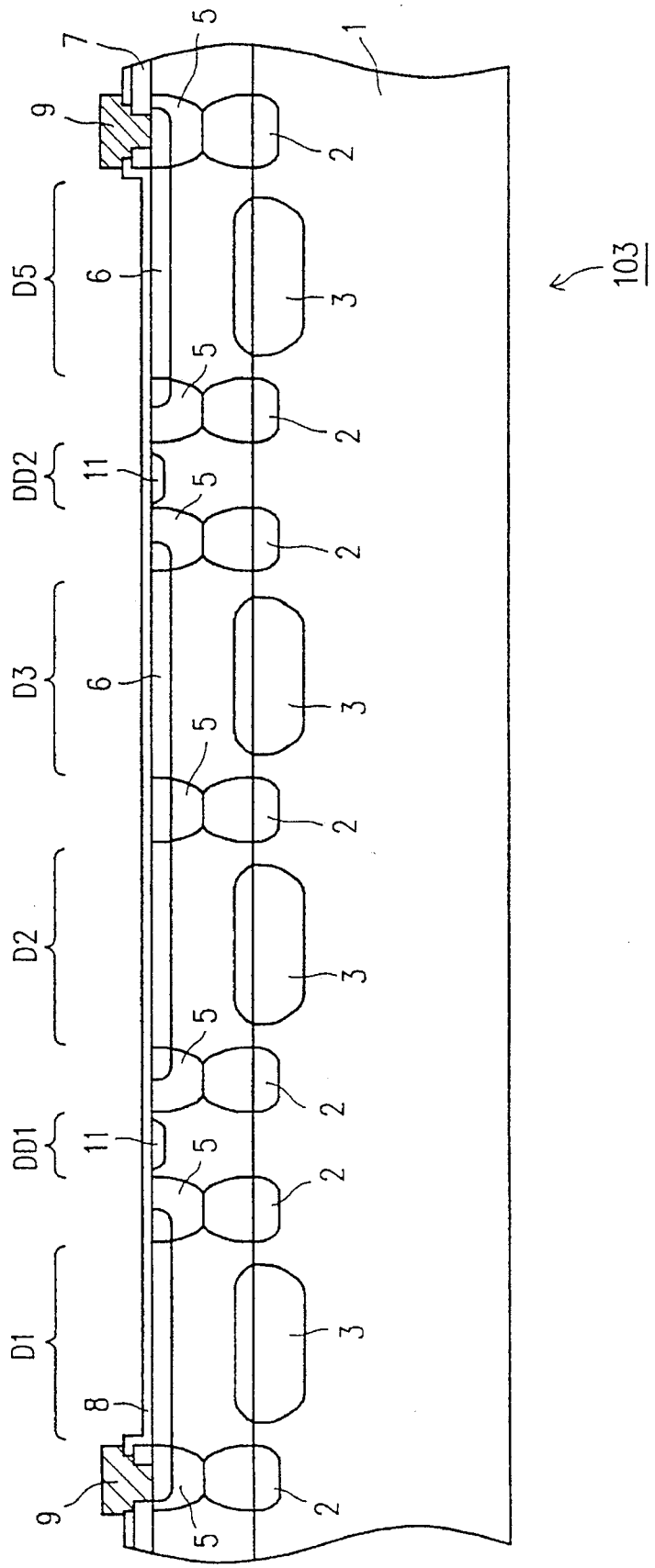
FIG. 19 is a cross-sectional view showing a split photodiode (light receiving device) of a third embodiment of the invention.

FIG. 19 shows a split photodiode according to a third embodiment of the invention which has another configuration for reducing the series resistance of the dummy photodiode portions. In FIG. 19, 103 designates the split photodiode of the third embodiment of the invention in which N-type high-density diffusion layers 11 are formed in the surfaces of the dummy photodiodes DD1 and DD2 in the configuration of the split photodiode shown in FIG. 16, so that the internal series resistance of the cathode side of the light detecting photodiode portion is reduced. Also in this structure, since the breakdown voltage at the junction of the dummy photodiode portion is not required to be maintained high, the distance between the N-type diffusion layer 11 and the P-type diffusion layers 5 can be reduced so long as the N-type diffusion layer 11 does not protrude beyond the P-type isolation diffusion layers 5, thereby reducing the width of the dummy photodiode portions.

When the width of the diffusion window for the P-type isolation diffusion layers 5 is set to be 4 μm, the lateral spread of the N-type high-density diffusion layer 11 is set to be 1 μm, and mask misalignment between the P-type isolation diffusion layers 5 and the N-type high-density diffusion layer 11 is set to be 2 μm, the minimum design value of the interval of the diffusion windows which is necessary for preventing the N-type high-density diffusion layer 11 from protruding beyond the P-type isolation diffusion layers 5 is obtained as follows:

$$1(\mu\text{m})+2(\mu\text{m})-4(\mu\text{m})=-1(\mu\text{m})$$

In other words, when the width of the diffusion window for the N-type high-density diffusion layer 11 is 5 μm, the width of the dummy photodiode portions can be set to 3 μm.

In a photodiode for an optical pickup using a hologram device, an anti-reflection film made of a silicon nitride film must be formed on the surface of the light receiving region in order to improve the optical sensitivity. In the structure where in a dummy photodiode portion is disposed and the N-type high-density diffusion layer 11 is formed on the surface of the portion, i.e., where the P-type diffusion layer 6 does not exist in the surface of the dummy photodiode portion, a PN junction exists in the surface of the dummy photodiode portion. When an anti-reflection film made of a silicon nitride film covers the PN junction, there arises a problem in that the increase of the interface level causes the leakage current of the PN junction to increase.

Figure 20:
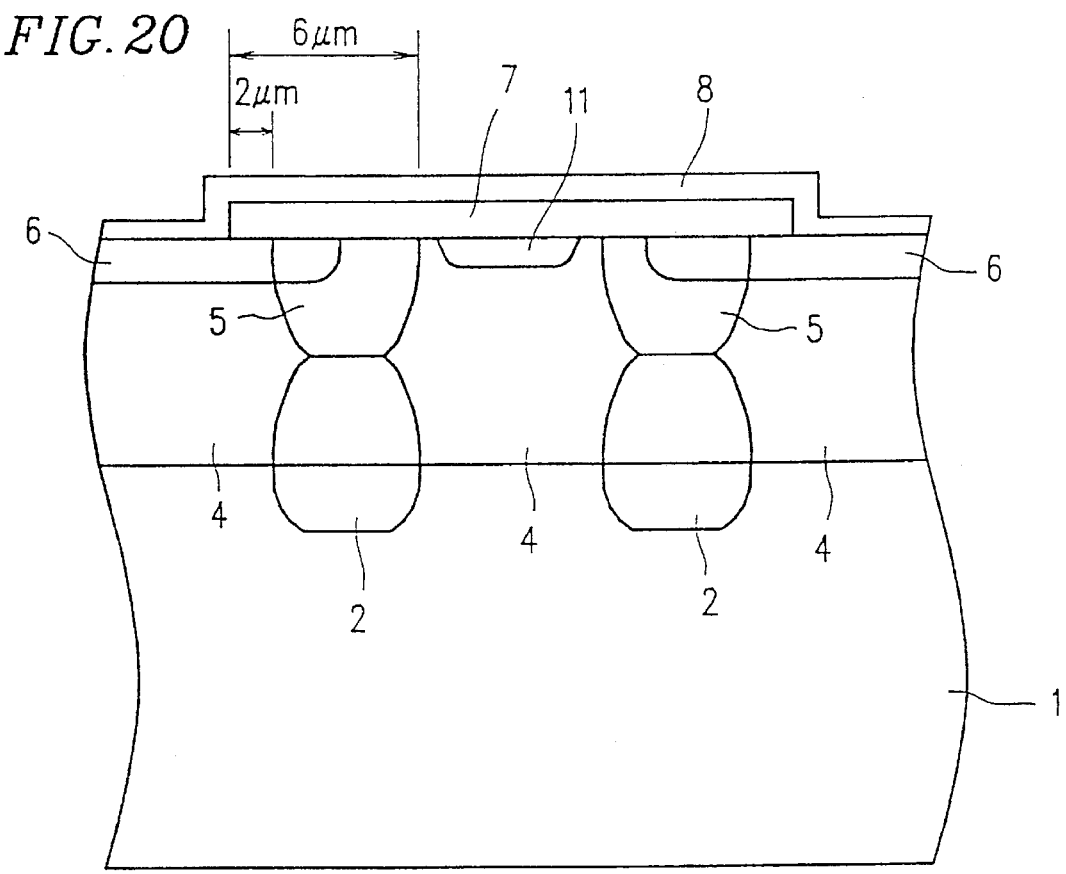
FIG. 20 is a cross-sectional view showing a device structure for illustrating features of the third embodiment in comparison with the split photodiode of the embodiment.

In order to prevent this phenomenon from occurring, a structure in which the silicon oxide film remains on the dummy photodiode portion so that the silicon nitride film is prevented from directly contacting a semiconductor layer may be produced. In this case, as shown in FIG. 20, areas where the anti-reflection film made of a silicon nitride film cannot be formed exist at both side ends of the photodiode portion for receiving signal light. When the areas are removed from the light receiving region, the segment pitch in the x-direction of the photodiode must be increased. This is not desirable.

In FIG. 20, for example, the portion where the silicon nitride film 8 directly contacts the surface of the photodiode portion for receiving signal light must be separated from the surface PN junction of the dummy photodiode portion by 6 μm or more, in order that the silicon nitride film 8 is prevented from overlapping the PN junction even when mask misalignment occurs.

The width of the diffusion window for the P-type isolation diffusion layers 5 is 4 μm. Consequently, a silicon oxide film of a width of 2 μm remains on an area of the photodiode portion for receiving signal light, which results in an increase of the surface reflectivity of the area. When the area is removed from the light receiving region, the pitch in the x-direction of the segments (the dummy photodiode portions) of the photodiode must be increased. This is not desirable.

In order to solve these problems, according to this embodiment, the cathode and the anode of the dummy photodiode segment (dummy photodiode portion) are short-circuited. Therefore, even when the silicon nitride film directly contacts the PN junction of the dummy photodiode portion leakage current flows.

Consequently, the employment of the structure of FIG. 19 in which the cathode and the anode of the dummy photodiode portion are short-circuited can reduce the internal series resistance of the dummy photodiode portion without increasing the segment pitch of the photodiode, thereby enabling the diode crosstalk to be reduced in level.

Figure 3:
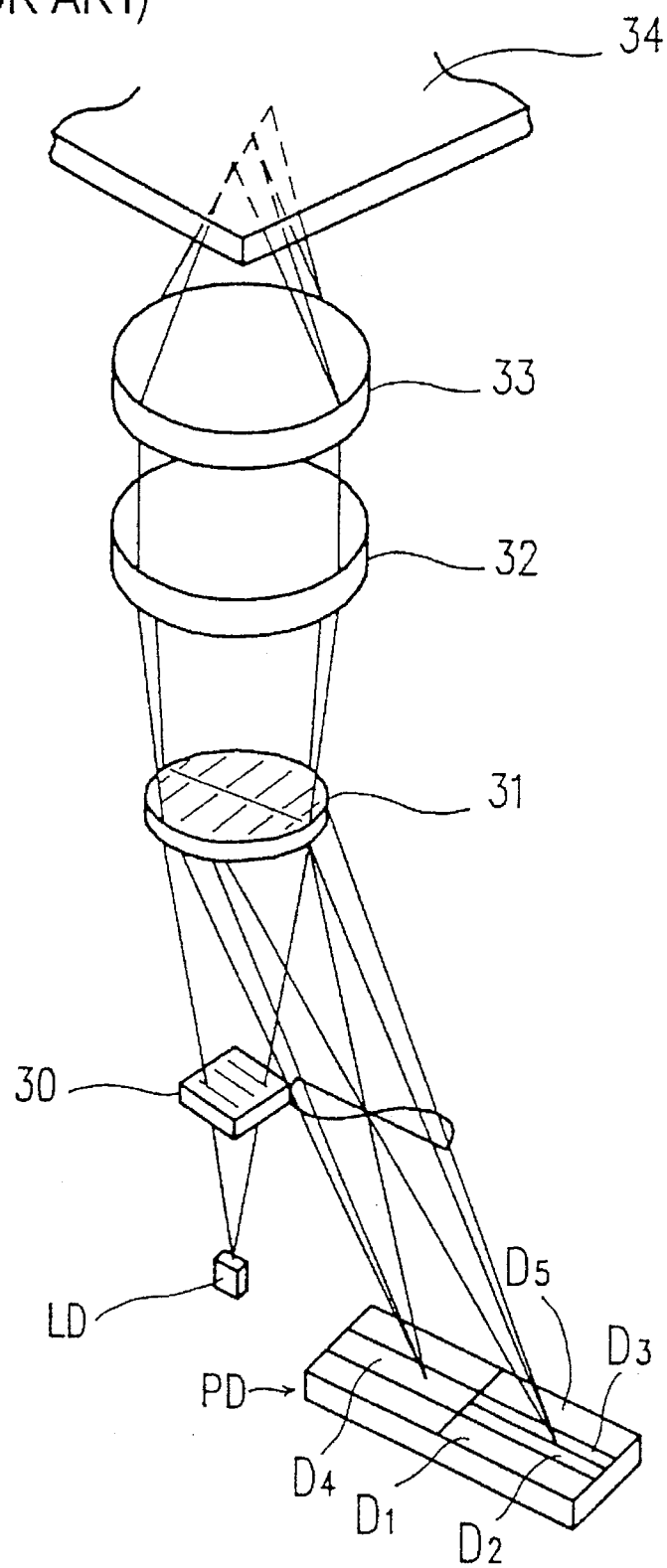
FIG. 3 is a diagram showing the configuration of a conventional optical pickup using a hologram device.
Figure 4:
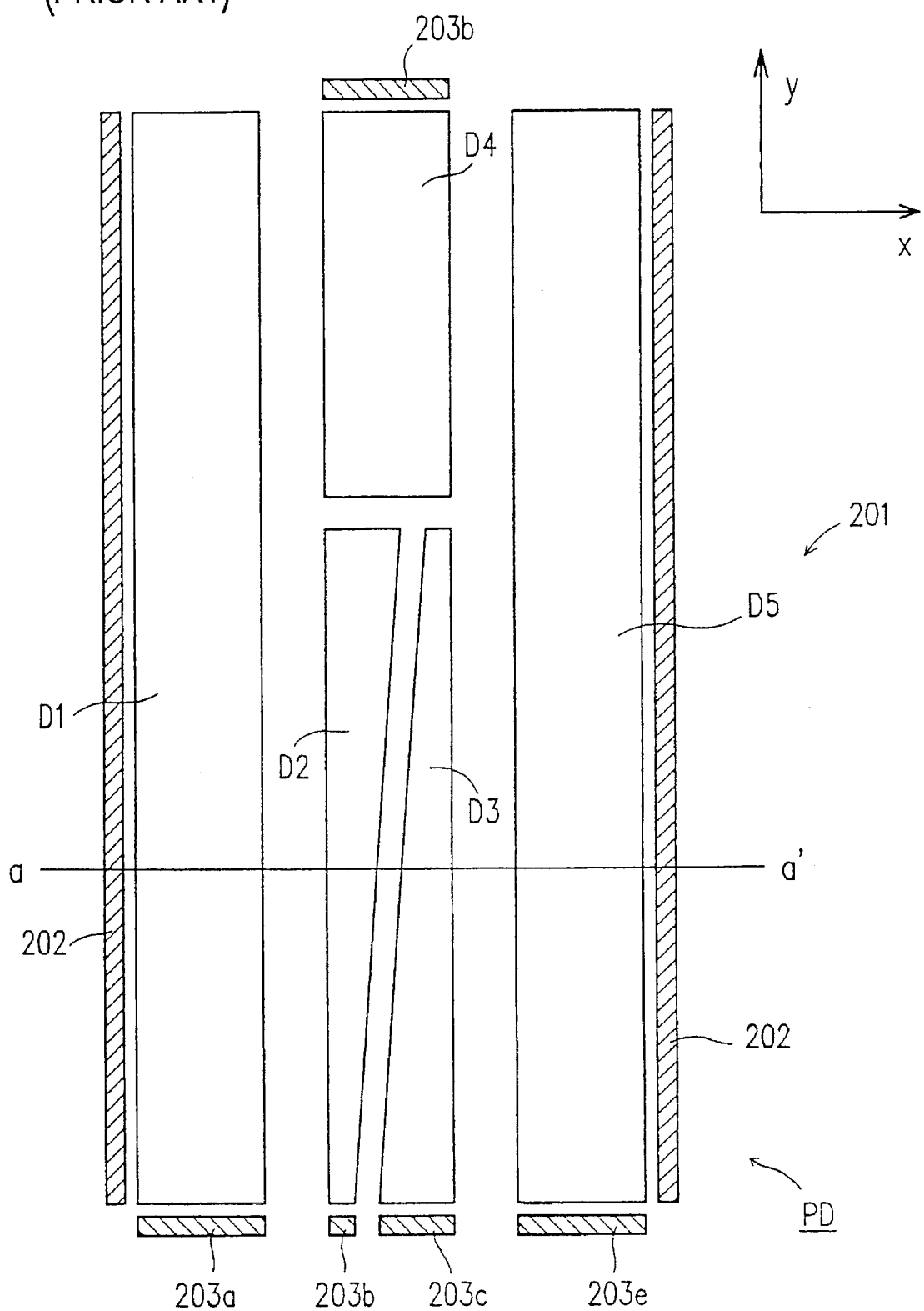
FIG. 4 is a plan view showing the structure of a conventional split photodiode which is used in the optical pickup shown in FIG. 3 and in which the light detecting portion is split into plural regions.

The invention may be applied to a photodiode constituting an optical pickup other than that shown in FIG. 3, or to a photodiode having a shape different from that of the split photodiode shown in FIG. 4.

As seen from the above description, according to the light receiving device of the invention, the semiconductor layer of the second conductivity type is buried in the part of the semiconductor substrate of the first conductivity type which constitutes split light detecting photodiode portions. Therefore, the semiconductor layer of the second conductivity type is positioned in the vicinity of the semiconductor layer of the first conductivity type which functions as an isolation region for the light detecting photodiode portions and around which optical carriers detour. Consequently, the distance in which optical carriers are caused to move by diffusion is shortened along the path in which optical carriers move form positions in the vicinity of the isolation regions to the PN junction plane while detouring around the isolation regions. This improves the response speed obtained when an isolation region for two adjacent light detecting photodiode portions is irradiated with light, and improves the cutoff frequency.

Moreover, since the distance between the semiconductor layers of the first and second conductivity types can be restricted, the focusing of the optical pickup can be correctly conducted even when these semiconductor layers are somewhat deviated positionally.

The problem of increased crosstalk which is feared to be adversely affected by the provision of the buried semiconductor layer of the second conductivity type in the light detecting photodiode portion can be solved by disposing the dummy photodiode portion between adjacent light detecting photodiode portions. In this case, the semiconductor layer of the second conductivity type is formed in the dummy photodiode portion so that the distance between the semiconductor layers of the first and second conductivity types is smaller than that in the light detecting photodiode portion, and the anode and the cathode of the dummy photodiode portion are short-circuited, thereby preventing the segment pitch in the width direction (x-direction) of the split photodiode from being increased.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light receiving device comprising: a semiconductor substrate of a first conductivity type;

a first semiconductor layer of a second conductivity type formed on said semiconductor substrate;

isolation regions of the first conductivity type extending from a surface of said first semiconductor layer remote from said substrate into said semiconductor substrate, said isolation regions splitting said first semiconductor layer into a plurality of first semiconductor regions of the second conductivity type;

a portion of said isolation regions of the first conductivity type which extends into said semiconductor substrate having a higher impurity density than that of said semiconductor substrate;

said plurality of first semiconductor regions of the second conductivity type and portions of the semiconductor substrate of the first conductivity type below said plurality of first semiconductor regions forming a plurality of light detecting photodiode portions for detecting signal light respectively, and second semiconductor regions of the second conductivity type buried in a part of said portions of said semiconductor substrate forming the light detecting photodiode portions, said second semiconductor regions being positioned in the vicinity of the portion of the isolation region which extends into said substrate, extending into said plurality of first semiconductor regions of the second conductivity type and having a higher impurity density than that of said plurality of first semiconductor regions of the second conductivity type, such that the diffusion length for optical carriers in the vicinity of the isolation region is reduced.

2. A light receiving device according to claim 1, wherein said isolation regions splitting said first semiconductor layer comprise a first diffusion region which is buried in said semiconductor substrate and a second diffusion region formed from said surface of said first semiconductor layer.

3. A light receiving device according to claim 1, wherein said second semiconductor regions buried in said semiconductor substrate have a depth which is greater than a depth of said isolation regions splitting said first semiconductor layer into a plurality of first semiconductor regions.

4. A light receiving device according to claim 1, wherein a depletion layer which extends from said second semiconductor regions buried in said semiconductor substrate contacts said isolation regions in at least one point.

5. A light receiving device comprising:

a semiconductor substrate of a first conductivity type;

a first semiconductor layer of a second conductivity type formed on said semiconductor substrate;

isolation regions of the first conductivity type extending from a surface of said first semiconductor layer remote from said substrate into said semiconductor substrate, said isolation regions splitting said first semiconductor layer into a plurality of first semiconductor regions of the second conductivity type;

a portion of said isolation regions of the first conductivity type which extends into said semiconductor substrate having a higher impurity density than that of said semiconductor substrate;

said plurality of first semiconductor regions of the second conductivity type and portions of the semiconductor substrate of the first conductivity type below said plurality of first semiconductor regions forming a plurality of light detecting photodiode portions for detecting signal light respectively, second semiconductor regions of the second conductivity type buried in a part of said portions of said semiconductor substrate which form the light detecting photodiode portions, a dummy photodiode portion, comprising said semiconductor substrate and said first semiconductor layer formed between adjacent light photodiode portions, and said dummy photodiode portion including a third high impurity density, higher than that of said first semiconductor regions, semiconductor buried region of the second conductivity type in a part of said semiconductor substrate which constitutes said dummy photodiode portions.

6. A light receiving device according to claim 5, wherein said dummy photodiode portion includes an anode and a cathode which are short-circuited.

7. A light receiving device according to claim 6, wherein a distance between said isolation region and said third high impurity density semiconductor buried region in said dummy photodiode portion is smaller than the distance between the isolation regions and the second semiconductor buried regions in said light detecting photodiode portions.

8. A light receiving device comprising:

a semiconductor substrate of a first conductivity type;

a first semiconductor layer of a second conductivity type formed on said semiconductor substrate;

isolation regions of the first conductivity type extending from a surface of said first semiconductor layer remote from said substrate into said semiconductor substrate, said isolation regions splitting said first semiconductor layer into a plurality of first semiconductor regions of the second conductivity type;

a portion of said isolation regions of the first conductivity type which extends into said semiconductor substrate having a higher impurity density than that of said semiconductor substrate;

said plurality of first semiconductor regions of the second conductivity type and portions of the semiconductor substrate of the first conductivity type below said plurality of first semiconductor regions forming a plurality of light detecting photodiode portions for detecting signal light respectively, second semiconductor regions of the second conductivity type buried in a part of said portions of said semiconductor substrate which form the light detecting photodiode portions, said device comprises a dummy photodiode portion which consists of said semiconductor substrate and said first semiconductor layer and is formed between adjacent light detecting photodiode portions, and said dummy photodiode portion comprises a third high impurity density, higher than that of said first semiconductor layer, semiconductor region of the second conductivity type formed in the surface of said first semiconductor layer.

9. A light receiving device according to claim 8, wherein said dummy photodiode portion includes an anode and a cathode which are short-circuited.

10. A light receiving device according to claim 6, wherein an anti-surface-reflection film made of a silicon nitride film is formed on surfaces of said first semiconductor regions of the second conductivity type which constitute said light detecting photodiode portions.

11. A light receiving device according to claim 9, wherein an anti-surface-reflection film made of a silicon nitride film is formed on surfaces of said first semiconductor regions of the second conductivity type which constitute said light detecting photodiode portions.

12. A light responsive device comprising, a semiconductor substrate of a first conductivity type;

a first semiconductor layer of a second conductivity type formed on said substrate;

isolation regions of a first conductivity type extending from a surface of said first layer and into said substrate dividing the first layer into a plurality of regions, portions of said isolation regions that extend into said substrate having a higher impurity density than said substrate;

said plurality of regions and contiguous portions of the substrate forming a plurality of light detecting junctions; and means, including a plurality of buried regions of the second conductivity type disposed in said plurality of regions and the substrate at said light detecting junctions and located in proximity to said isolation regions extending into said substrate, for decreasing the diffusion length for carriers generated in the vicinity of the isolation regions to a depletion region of a junction of said light detecting junctions.

13. A light responsive device in claim 12 wherein the distance between an isolation region and a buried region located in proximity thereto is less than the route distance from a point on the outer periphery of the isolation region to the first semiconductor layer.

* * * * *